(12) United States Patent
Lu

(10) Patent No.: US 12,046,523 B2
(45) Date of Patent: Jul. 23, 2024

(54) SEMICONDUCTOR DEVICE PACKAGES AND METHODS OF MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 36 days.

(21) Appl. No.: 16/681,539

(22) Filed: Nov. 12, 2019

(65) Prior Publication Data

US 2021/0143072 A1 May 13, 2021

(51) Int. Cl.
| | |
|---|---|
| H01L 23/16 | (2006.01) |
| H01L 21/48 | (2006.01) |
| H01L 21/56 | (2006.01) |
| H01L 23/31 | (2006.01) |
| H01L 23/538 | (2006.01) |
| H01L 23/66 | (2006.01) |
| H01L 25/00 | (2006.01) |
| H01L 25/16 | (2023.01) |
| H01L 21/683 | (2006.01) |
| H01L 23/00 | (2006.01) |

(52) U.S. Cl.
CPC .......... *H01L 23/16* (2013.01); *H01L 21/4846* (2013.01); *H01L 21/565* (2013.01); *H01L 23/3128* (2013.01); *H01L 23/5384* (2013.01); *H01L 23/5386* (2013.01); *H01L 23/66* (2013.01); *H01L 25/16* (2013.01); *H01L 25/50* (2013.01); *H01L 21/6835* (2013.01); *H01L 24/16* (2013.01); *H01L 2223/6616* (2013.01); *H01L 2224/16225* (2013.01); *H01L 2924/3511* (2013.01)

(58) Field of Classification Search
CPC .......................... H01L 23/16; H01L 21/4846
See application file for complete search history.

(56) References Cited

U.S. PATENT DOCUMENTS

| | | | |
|---|---|---|---|
| 11,538,804 B2* | 12/2022 | Then | H01L 29/42384 |
| 2005/0110166 A1* | 5/2005 | Aoyagi | H01L 25/105 |
| | | | 257/781 |
| 2017/0005044 A1* | 1/2017 | Ishido | H01L 23/49838 |
| 2019/0013284 A1* | 1/2019 | Fang | H01L 21/4853 |
| 2019/0051590 A1* | 2/2019 | Fang | H01L 24/83 |
| 2019/0051615 A1 | 2/2019 | Nair et al. | |
| 2019/0053373 A1* | 2/2019 | Lu | H05K 1/111 |
| 2019/0115294 A1* | 4/2019 | Lu | H01L 24/16 |
| 2019/0206824 A1* | 7/2019 | Lu | H01L 24/20 |
| 2019/0363040 A1* | 11/2019 | Lu | H01L 25/16 |
| 2020/0144185 A1* | 5/2020 | Lu | H01L 21/6835 |
| 2021/0066188 A1* | 3/2021 | Lu | H01L 23/5226 |
| 2021/0134781 A1* | 5/2021 | Chan | H01L 24/13 |
| 2022/0344230 A1* | 10/2022 | Chang | H01L 23/552 |

* cited by examiner

*Primary Examiner* — Thao P Le
(74) *Attorney, Agent, or Firm* — FOLEY & LARDNER LLP

(57) ABSTRACT

A semiconductor device package includes a substrate; an electronic component disposed on the substrate; multiple supporting structures disposed on the substrate; and a reinforced structure disposed on the supporting structures and extending in parallel with the substrate.

20 Claims, 31 Drawing Sheets

14

14E1

SEMICONDUCTOR DEVICE PACKAGES AND METHODS OF MANUFACTURING THE SAME

BACKGROUND

1. Field of the Disclosure

The present disclosure relates to semiconductor device packages and methods of manufacturing the same.

2. Description of Related Art

A semiconductor device package may include some semiconductor devices stacked atop one another. Bonding technique, which may refer to bonding that involves two or more materials, can be used to form a semiconductor device package. However, the coefficient of thermal expansion (CTE) mismatch of two or more materials during or subsequent to thermal cycle(s) may result in warpage or delamination problems, which adversely affects reliability or performance of the semiconductor device package.

SUMMARY

According to some example embodiments of the instant disclosure, a semiconductor device package includes a substrate; an electronic component disposed on the substrate; a plurality of supporting structures disposed on the substrate; and a reinforced structure disposed on the supporting structures and extending in parallel with the substrate.

According to some example embodiments of the instant disclosure, a semiconductor device package includes a substrate; a plurality of electronic components disposed on the substrate; a reinforced structure disposed over the substrate; and a package body disposed on the substrate and covering the electronic components and at least a portion of the reinforced structure, wherein a hardness of the reinforced structure is greater than a hardness of the package body.

According to some example embodiments of the instant disclosure, a method of manufacturing a semiconductor device package includes: providing a substrate; disposing a first electronic component on a first side of the substrate; forming a first supporting structure on the first side of the substrate; and disposing a first reinforced structure on the supporting structure.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
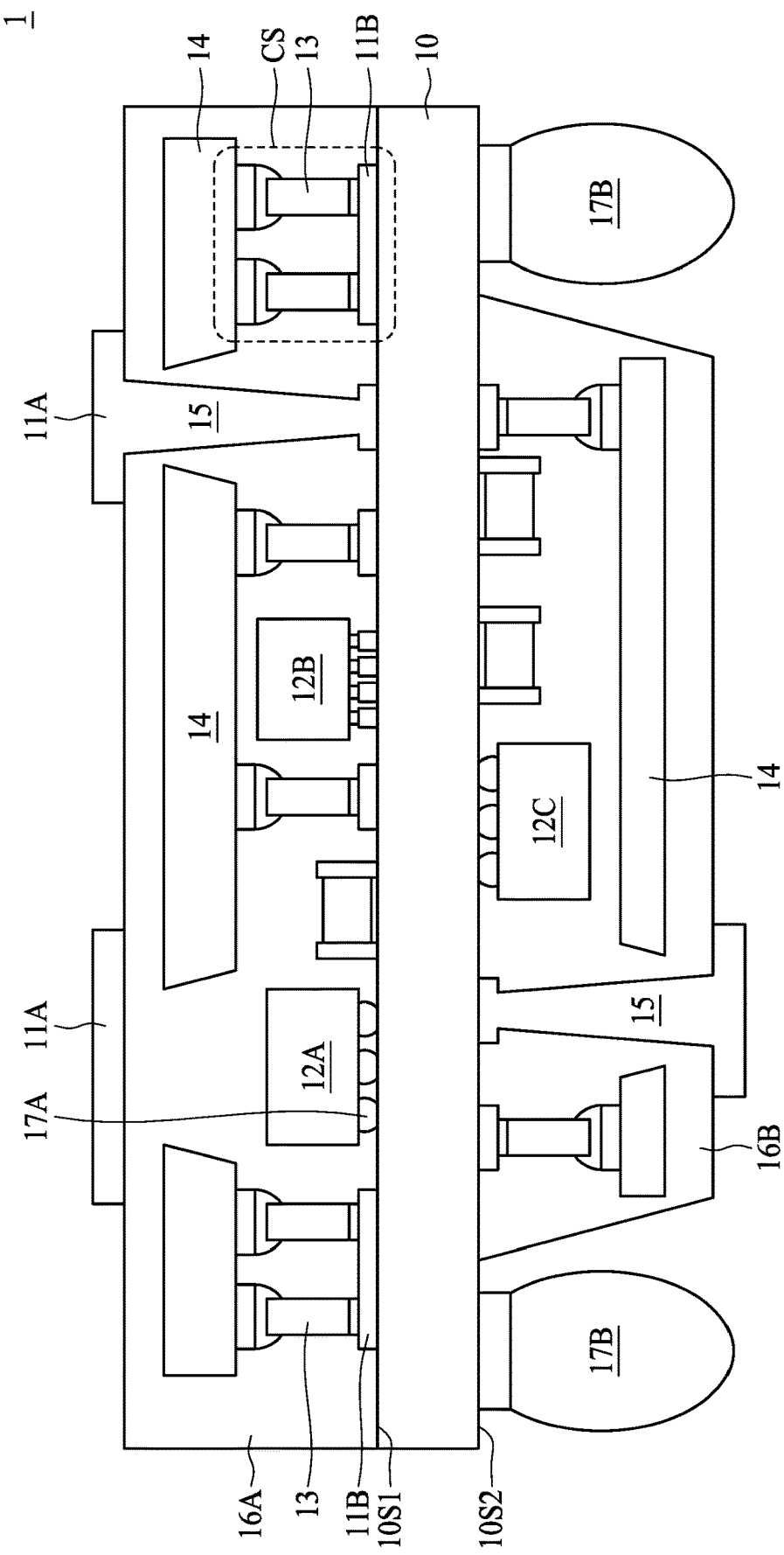
FIG. 1A is a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A is a cross-sectional view of a semiconductor device package 1 in accordance with some embodiments of the present disclosure. The semiconductor device package 1 includes a substrate 10, patterned conductive layers 11A and 11B, electronic components 12A-12C, supporting structures 13, a reinforced structure 14, conductive pillars 15, package bodies 16A and 16B, and a plurality of solder balls 17A and 17B.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL) or a grounding element.

The electronic components 12A, 12B and 12C may be electrically connected to the substrate 10 by the solder balls 17A. Each of the electronic components 12A, 12B and 12C include a plurality of semiconductor devices, such as, but not limited to, transistors, capacitors and resistors interconnected together by a die interconnection structure into functional circuits to thereby form an integrated circuit. As will be understood by those skilled in the art, the device side of the semiconductor die includes an active portion including integrated circuitry and interconnection.

The supporting structure 13 is disposed on the substrate to provide a support for the reinforced structure 14. The supporting structure 13 may have a height of 20 um to 500 um. The supporting structure 13 may have a diameter of 20 um to 200 um. The supporting structure 13 may be or include aluminum (Al), copper (Cu), titanium (Ti), tungsten (W) or other suitable material(s) (e.g., metal, alloy or non-metal conductive material(s)). The supporting structure 13 may also include epoxy resin, a polyimide, a phenolic compound, a silicone dispersed therein, or a combination thereof. The patterned conductive layer 11B may include Al, Cu, Ti, W or other suitable material(s) (e.g., metal, alloy or non-metal conductive material(s)).

The reinforced structure 14 is formed or disposed on the supporting structure 13. The reinforced structure 14 may be supported or sustained by the supporting structure 13. The reinforced structure 14 may be connected to the substrate 10 by the supporting structure 13. The supporting structure 13 may be used to locate the reinforced structure 14 and provide a substantially planar surface for disposing the reinforced structure 14. In some embodiments, the reinforced structure 14 extends in parallel with the substrate 10. In other embodiments, the reinforced structure 14 laterally extends beyond a lateral surface of the supporting structure 13.

The reinforced structure 14 may have material(s) which can resist relatively high stress, impact, warpage, bending, twisting or other physical or structural change. The reinforced structure 14 may be metallic, plastic or glass. The reinforced structure 14 may be or include Al, Cu, Ti, W or other suitable material(s) (e.g., metal, alloy or non-metal conductive material(s)). The reinforced structure 14 may also include epoxy resin, a polyimide, a phenolic compound, a silicone dispersed therein, or a combination thereof.

A hardness of the reinforced structure 14 may be greater than a hardness of the supporting structure 13. A hardness of the reinforced structure 14 may be substantially the same as a hardness of the supporting structure 13. The reinforced structure 14 may be used to resist physical or structural force such as warpage, bending or twisting. Therefore, the warpage or delamination issue can be solved to improve the reliability or performance of the semiconductor device package 1.

In some embodiments, the electronic components 12B and 12C are disposed within a projection of the reinforced structure 14 on the surfaces 10S1 and 10S2 of the substrate 10 respectively. The electronic components 12B and 12C may be fully covered by the reinforced structure 14 from a top view of the semiconductor device package 1. The electronic component 12A is disposed outside the projection of the reinforced structure 14. The electronic component 12A may not be fully covered by the reinforced structure 14 from a top view of the semiconductor device package 1.

The conductive pillar 15 is formed or disposed on the substrate 10. The conductive pillar 15 may be connected to the substrate 10 by the patterned conductive layer 11B. The conductive pillar 15 electrically connects the patterned conductive layer 11A with the substrate 10. The conductive pillar 15 may extend in parallel with the supporting structure 13. The conductive pillar 15 may extend vertically to the substrate 10. The conductive pillar 15 may extend vertically to the reinforced structure 14. The conductive pillar 15 may not be in direct contact with the supporting structure 13 and the reinforced structure 14. In some embodiments, the conductive pillar 15 may be used as a stress buffer to resist the physical force and sustain the semiconductor device package 1.

The conductive pillar 15 may be conductive or non-conductive. The conductive pillar 15 may be or include Al, Cu, Ti, W or other suitable material(s) (e.g., metal, alloy or non-metal conductive material(s)). The conductive pillar 15 may also include epoxy resin, a polyimide, a phenolic compound, a silicone dispersed therein, or a combination thereof.

The package bodies 16A and 16B are disposed on the substrate and cover or encapsulate the substrate 10, the patterned conductive layer 11B, the electronic components 12A-12C, the supporting structures 13, the reinforced structure 14 and the conductive pillars 15. The package bodies 16A and 16B may include an epoxy resin including filler therein, a molding compound (e.g., an epoxy molding compound or other molding compound), a polyimide, a phenolic compound or material, a material including a silicone dispersed therein, or a combination thereof. A plurality of solder balls 17B are formed on the surface 10S2 of the substrate 10.

Figure 1B:
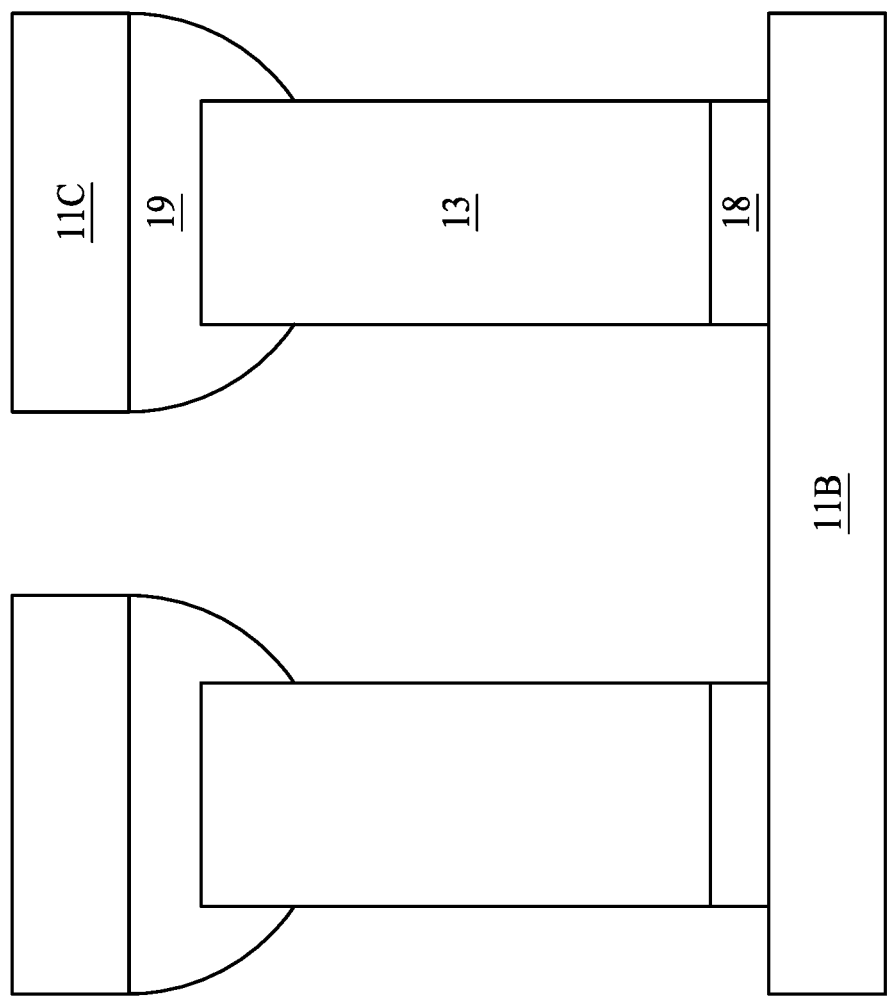
FIG. 1B, FIG. 1C and FIG. 1D are cross-sectional views of supporting structures in accordance with some embodiments of the present disclosure.
Figure 1C:
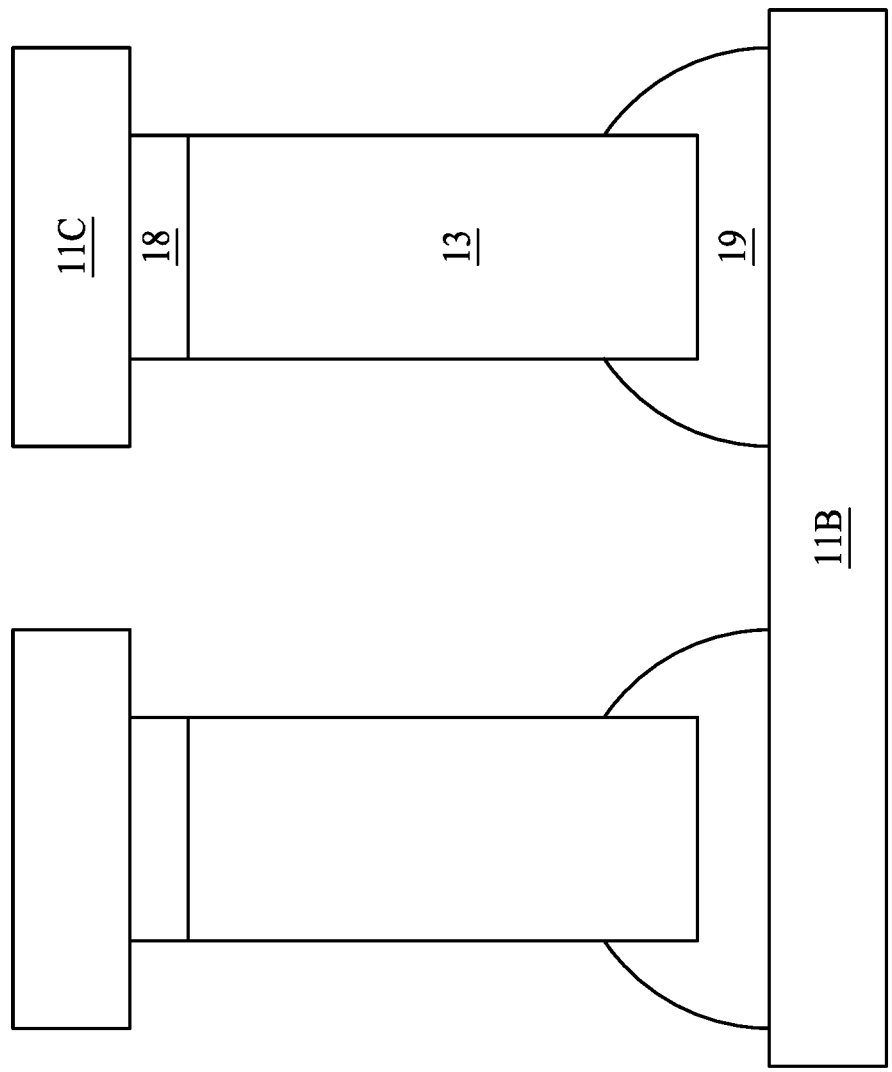
Figure 1D:
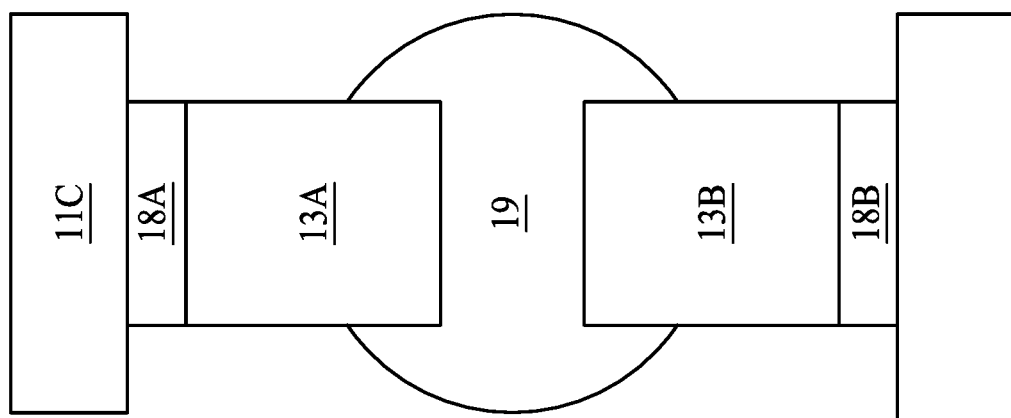

FIG. 1B, FIG. 1C and FIG. 1D are cross-sectional views of the supporting structures 13 in accordance with some embodiments of the present disclosure. Referring to FIG. 1B, the supporting structures 13 may be connected to the patterned conductive layer 11B by the connecting structure 18. The supporting structures 13 may be connected to the patterned conductive layer 11C by the connecting layer 19. The connecting structure 18 may be solder alloy or may include an epoxy resin including filler therein, a molding compound (e.g., an epoxy molding compound or another molding compound). The connecting layer 19 may include Al, Cu, Ti, W or other suitable material(s) (e.g., metal, alloy or non-metal conductive material(s)).

Referring to FIG. 1C, in some embodiments, the supporting structures 13 may be connected to the patterned conductive layer 11B by the connecting layer 19. The supporting structures 13 may be connected to the patterned conductive layer 11C by the connecting structure 18.

Referring to FIG. 1D, two supporting structures 13A and 13B in association with two connecting structures 18A and 18B are included. The connecting layer 19 is formed between the supporting structures 13A and 13B. The supporting structure 13A may be connected to the patterned conductive layer 11C by the connecting structure 18A. The supporting structure 13B may be connected to the patterned conductive layer 11B by the connecting structure 18B.

Figure 2A:
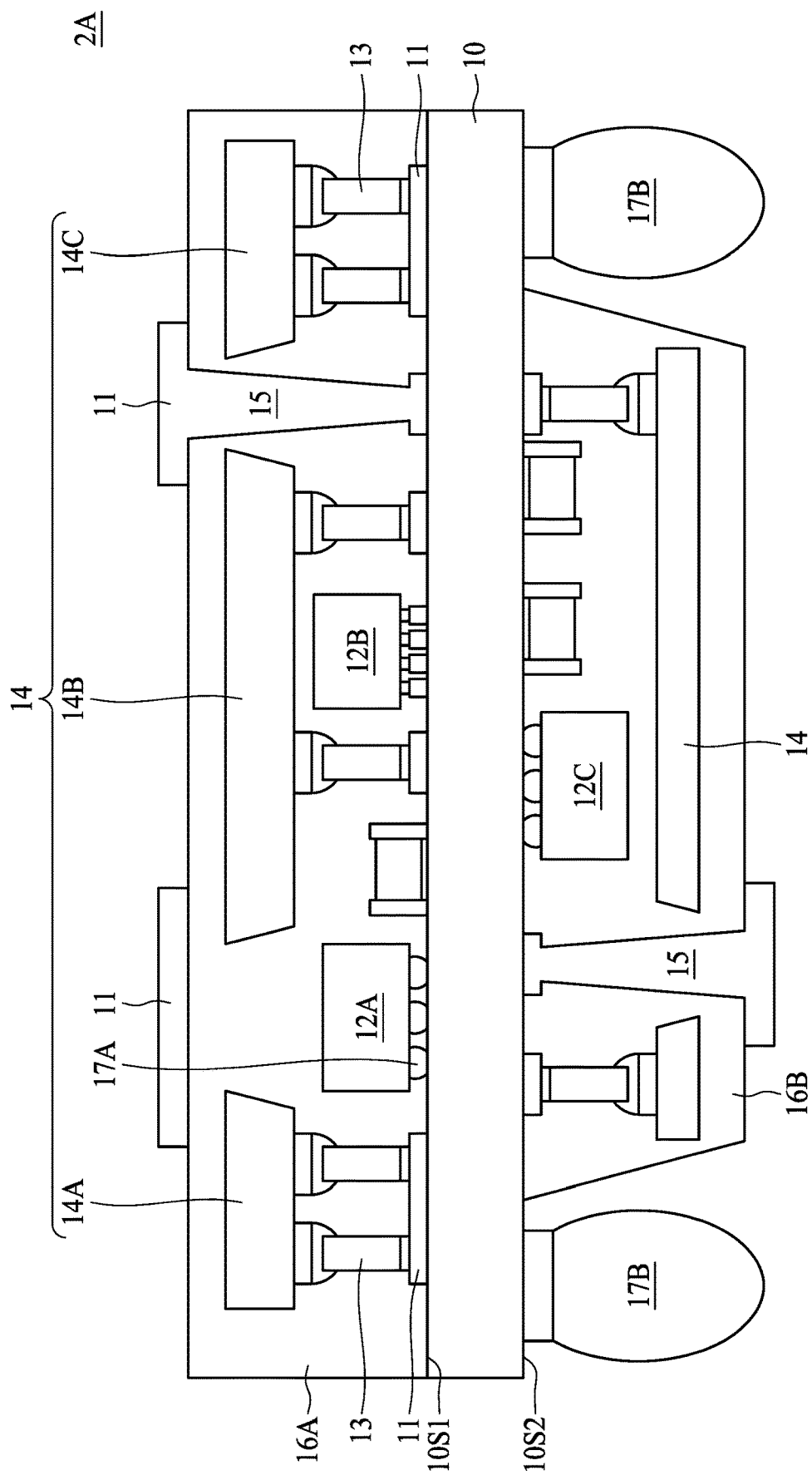
FIG. 2A, FIG. 2B, FIG. 2C and FIG. 2D are cross-sectional views of semiconductor device packages in accordance with some embodiments of the present disclosure.

FIG. 2A, FIG. 2B, FIG. 2C and FIG. 2D are cross-sectional views of the semiconductor device packages 2A, 2B, 2C and 2D in accordance with some embodiments of the present disclosure. Referring to FIG. 2A, the reinforced structures 14A, 14B and 14C are supported by the supporting structure 13. The heights of the reinforced structures 14A, 14B and 14C may be substantially the same. The shape or profile of the reinforced structures 14A, 14B and 14C may be substantially the same.

Figure 2B:
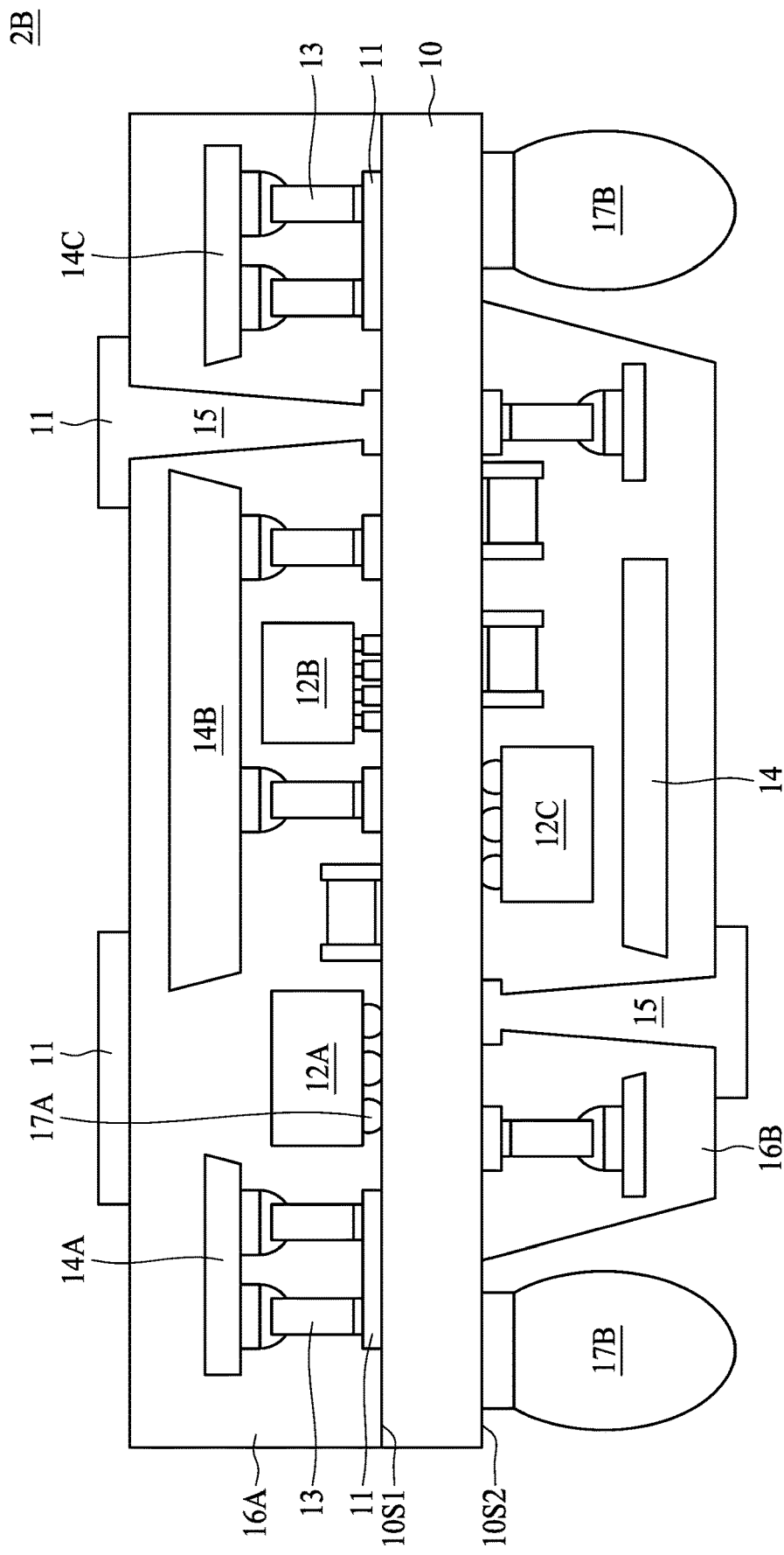

The semiconductor device package 2B is similar to the semiconductor device package 2A, and the differences therebetween are described below. Referring to FIG. 2B, a height of the reinforced structure 14B is greater than the heights of the reinforced structures 14A and 14C. The sustaining force of the reinforced structures 14A, 14B and 14C may be proportional to their heights. Therefore, the sustaining force of the reinforced structure 14B may be greater than the sustaining force of the reinforced structures 14A and 14C.

Figure 2C:
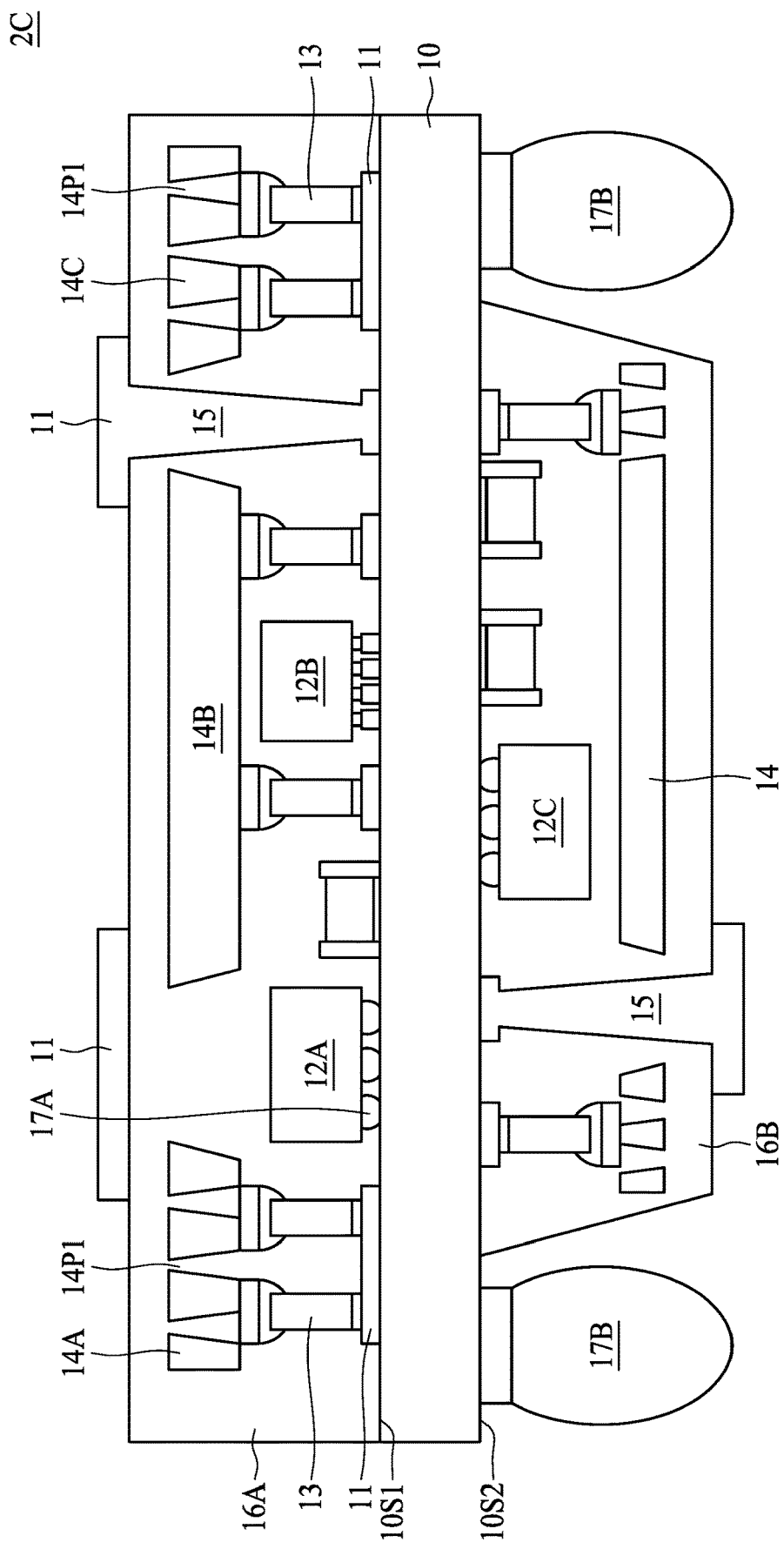

The semiconductor device package 2C is similar to the semiconductor device package 2A, and the differences therebetween are described below. Referring to FIG. 2C, The shape or profile of the reinforced structures 14A, 14B and 14C may be different. The reinforced structure 14A may be formed as one piece. The reinforced structure 14A may not include a hole, space or opening. The reinforced structures 14A and 14C may include holes 14P1. The space, opening or holes 14P1 may be arranged within the reinforced structures 14A and 14C for passing through the molding flow of the package body 16A.

Figure 2D:
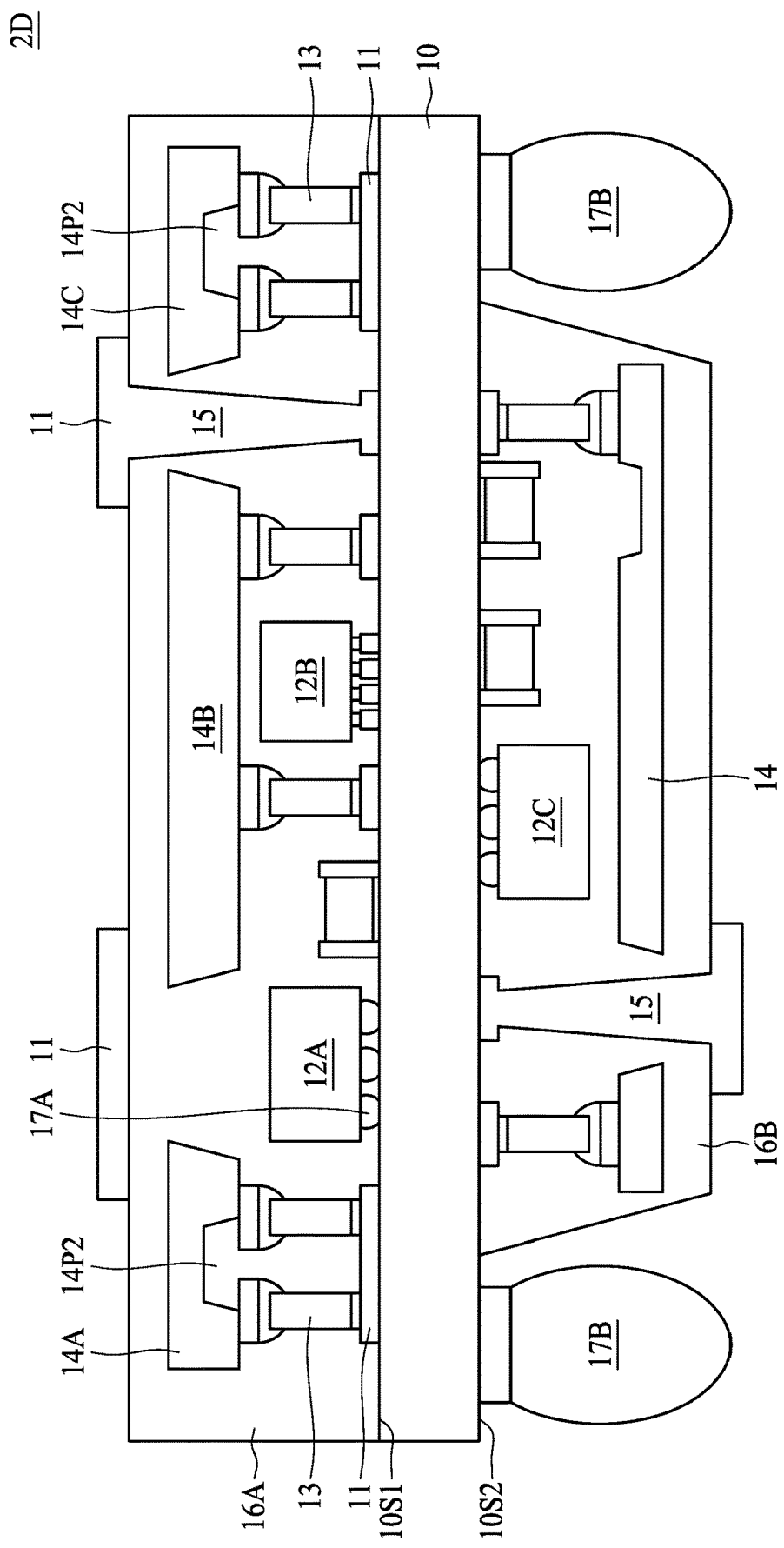

The semiconductor device package 2D is similar to the semiconductor device package 2A, and the differences therebetween are described below. Referring to FIG. 2D, The shape or profile of the reinforced structures 14A, 14B and 14C may be different. The reinforced structure 14A may be formed as one piece. The reinforced structure 14A may not include a recess or a notch. The reinforced structures 14A and 14C may include a recess 14P2 or a notch. The recess 14P2 may face the substrate 10. The recess 14P2 may be in direct contact with two patterned conductive layers 11C. The recess 14P2 may be surrounded by the patterned conductive layer 11C and the reinforced structure 14A/14C.

Figure 3A:
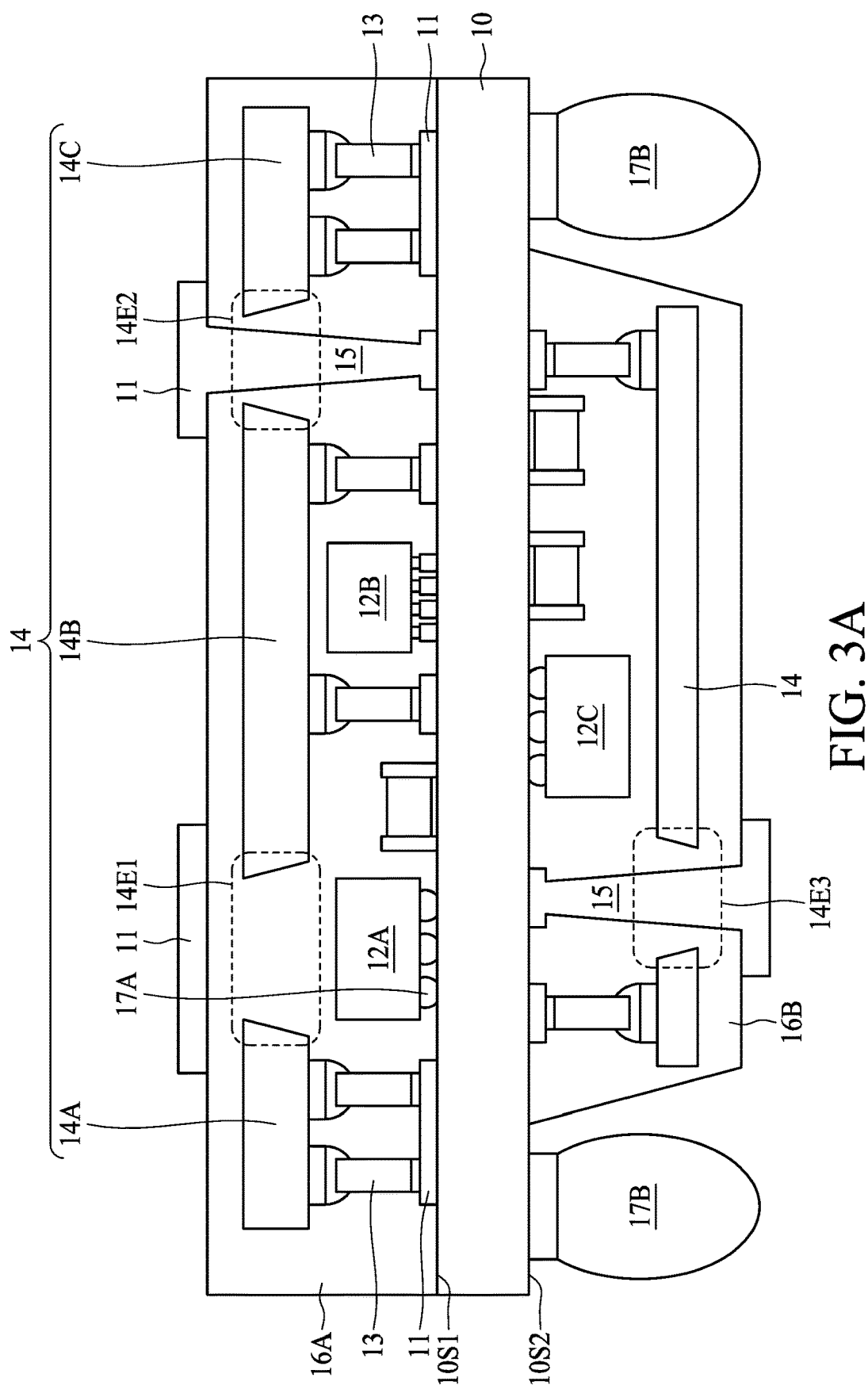
FIG. 3A is a cross-sectional view of a semiconductor device package in accordance with some embodiments of the present disclosure.

FIG. 3A is a cross-sectional view of a semiconductor device package 3 in accordance with some embodiments of the present disclosure. The supporting structure 13 is disposed on the substrate 10 to provide a support for the reinforced structure 14. The reinforced structure 14 may include several openings 14E1, 14E2 and 14E3. The electronic component 12A is disposed on the surface 10S1 of the substrate 10. In some embodiments, the electronic component 12A is arranged below the opening 14E1. The electronic component 12A may be a microwave component, which relates to miniature passive RF and microwave devices (e.g., filters, transmission lines, delay lines, and the like). The electronic component 12A may be manufactured using, at least in part, a multi-layer electrodeposition technique known as electrochemical fabrication.

The opening 14E2 is arranged between the reinforced structures 14B and 14C to embrace the conductive pillar 15. The conductive pillar 15 may be connected to the substrate 10 by the patterned conductive layer 11B. The conductive pillar 15 electrically connects the patterned conductive layer 11A with the substrate 10. The conductive pillar 15 does not contact the reinforced structures 14B and 14C. The conductive pillar 15 may penetrate or pass through the opening 14E2.

Figure 3B:
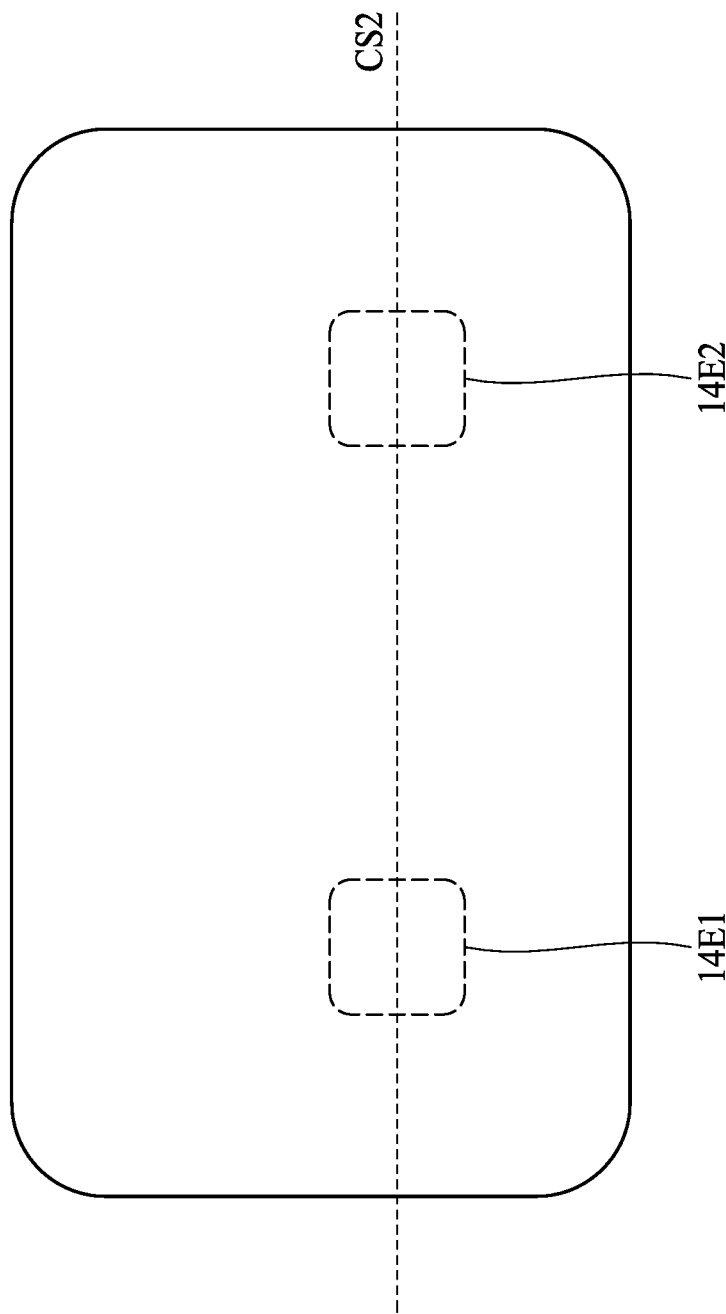
FIG. 3B, FIG. 3C, FIG. 3D, FIG. 3E, FIG. 3F and FIG. 3G are top views of reinforced structures in accordance with some embodiments of the present disclosure.

FIG. 3B, FIG. 3C, FIG. 3D, FIG. 3E, FIG. 3F and FIG. 3G are top views of reinforced structures 14 in accordance with some embodiments of the present disclosure. Referring to FIG. 3B, the reinforced structure 14 may have a fillet or a fillet-like profile. The openings 14E1 and 14E2 may be arranged within the reinforced structure 14 from a top view of the semiconductor device package 3. The cross-sectional view CS2 of the semiconductor device package 3 is illustrated in FIG. 3A.

Figure 3E:
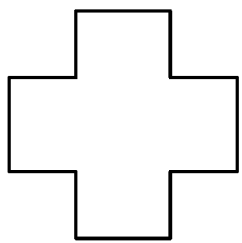
Figure 3D:
Figure 3G:
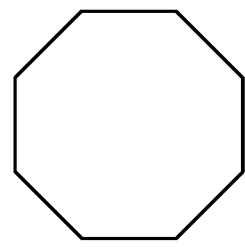
Figure 3C:
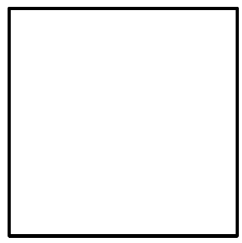

Referring to FIG. 3C, the reinforced structure 14 may have a square or a square-like profile. Referring to FIG. 3D, the reinforced structure 14 may have a rectangle or a rectangle-like profile. Referring to FIG. 3E, the reinforced structure 14 may have a cross or a cross-like profile.

Figure 3F:
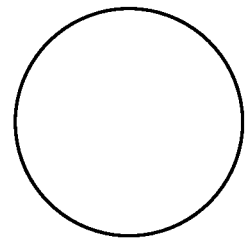

Referring to FIG. 3F, the reinforced structure 14 may have a circle or a circle-like profile. Referring to FIG. 3G, the reinforced structure 14 may have an irregular or an irregular-like profile.

Figures 3H, 3I, 3J, 3K, 3L, 3M:
FIG. 3H, FIG. 3I, FIG. 3J, FIG. 3K, FIG. 3L and FIG. 3M are top views of openings in accordance with some embodiments of the present disclosure.

FIG. 3H, FIG. 3I, FIG. 3J, FIG. 3K, FIG. 3L and FIG. 3M are top views of openings 14E1 to 14E3 in accordance with some embodiments of the present disclosure. Referring to FIG. 3H, the opening 14E1 may have a trapezoid or a trapezoid-like profile. Referring to FIG. 3I, the opening 14E1 may have a triangle or a triangle-like profile. Referring to FIG. 3J, the opening 14E1 may have a square or a square-like profile. Referring to FIG. 3K, the opening 14E1 may have a circle or a circle-like profile. Referring to FIG. 3L, the opening 14E1 may have a rectangle or a rectangle-like profile. Referring to FIG. 3M, the opening 14E1 may have an irregular or an irregular-like profile.

Figure 4A:
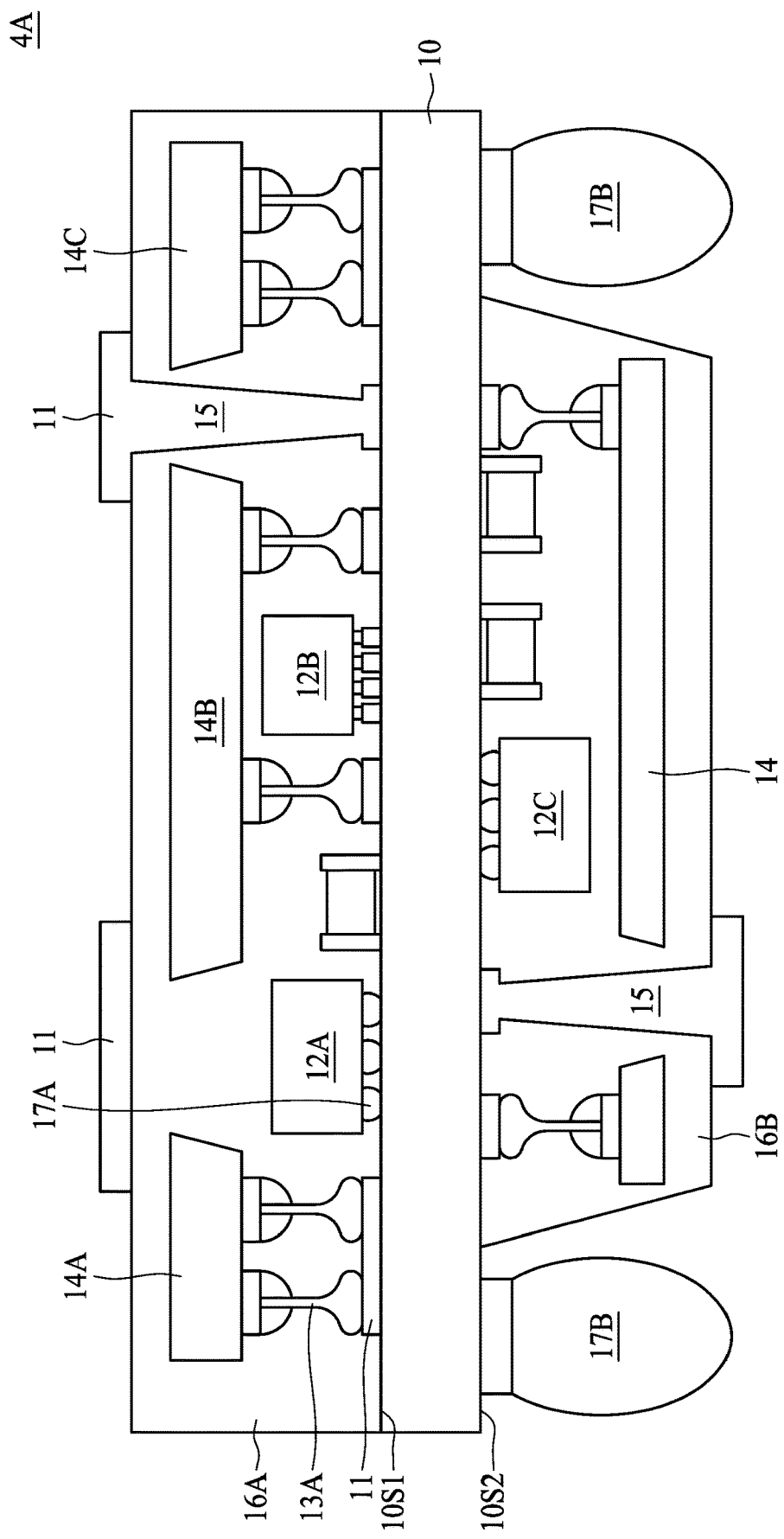
FIG. 4A, FIG. 4B and FIG. 4C are cross-sectional views of a semiconductor device package in accordance with some embodiments of the present disclosure.
Figure 4B:
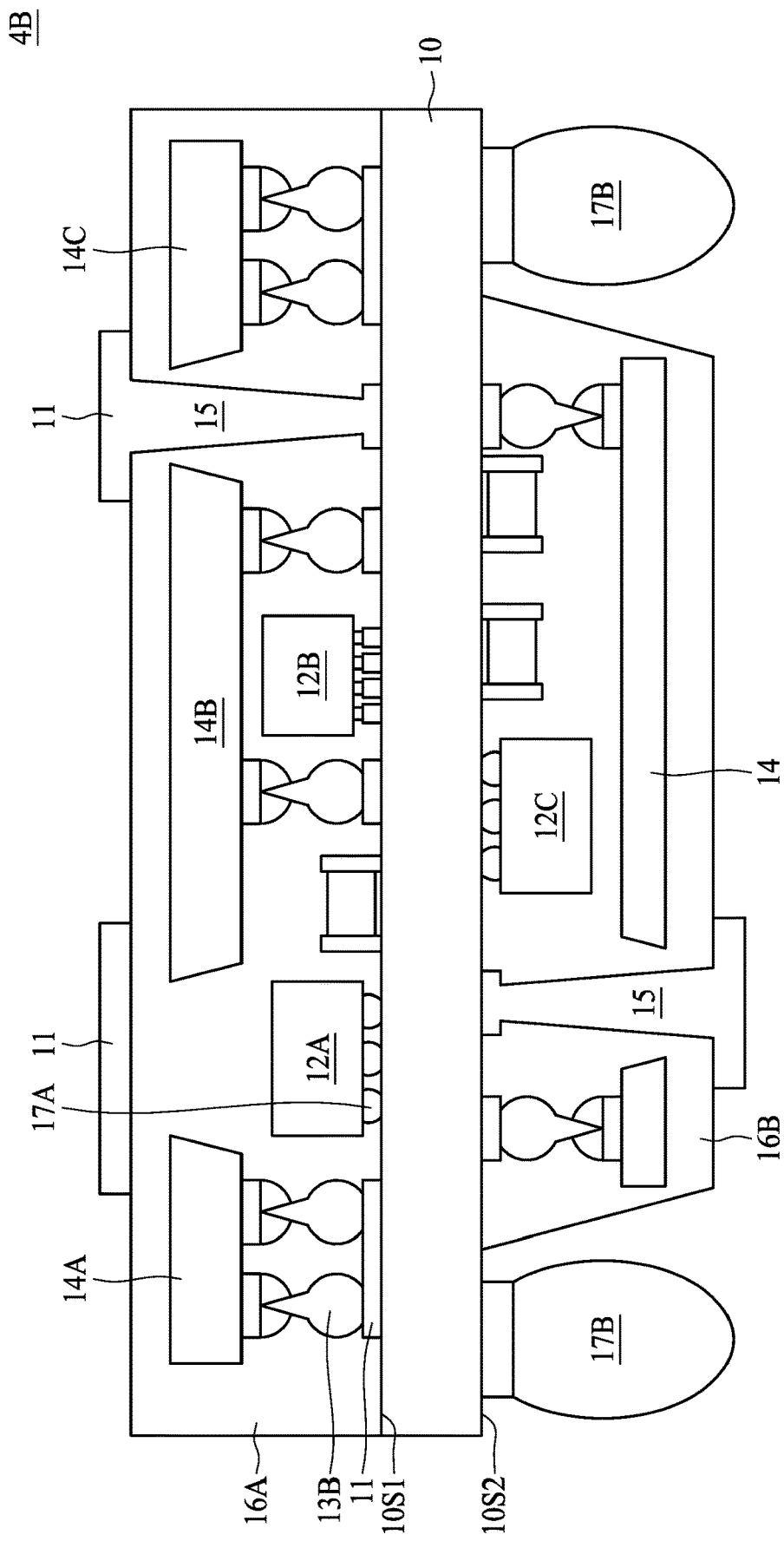
Figure 4C:
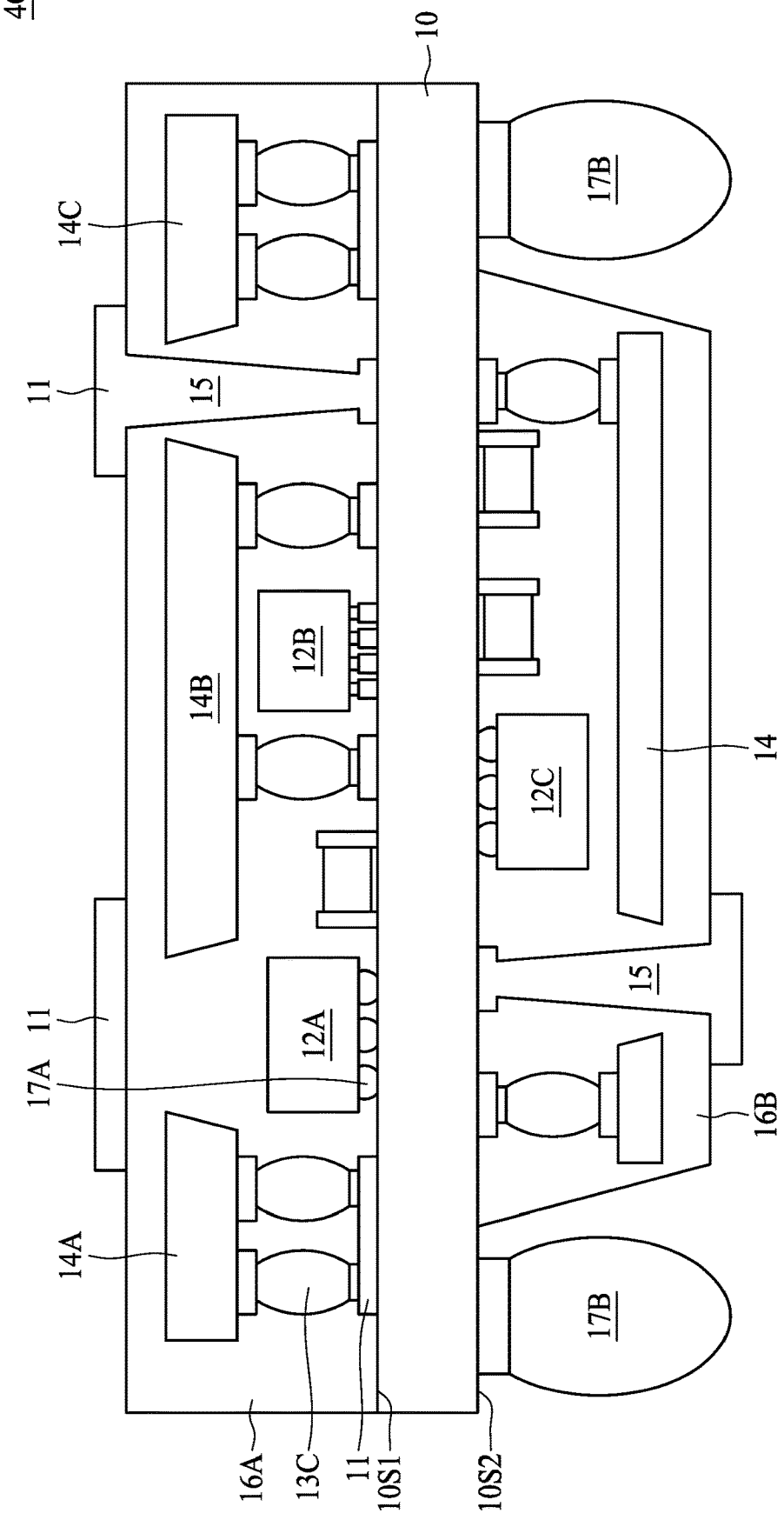

FIG. 4A, FIG. 4B and FIG. 4C are cross-sectional views of a semiconductor device package in accordance with some embodiments of the present disclosure. The semiconductor device package 4A is similar to the semiconductor device package 3A, and the differences therebetween are described below. Referring to FIG. 4A, the bonding wire 13A may be used to replace the supporting structure 13 of FIG. 3A. The bonding wire 13A may have a funnel or a funnel-like profile.

The semiconductor device package 4B is similar to the semiconductor device package 4A, and the differences therebetween are described below. Referring to FIG. 4B, the stud bump 13B may be used to replace the bonding wire 13A of FIG. 4A. The stud bump 13B may have a drip or a drip-like profile.

The semiconductor device package 4C is similar to the semiconductor device package 4A, and the differences therebetween are described below. Referring to FIG. 4C, the solder bump 13C may be used to replace the bonding wire 13A of FIG. 4A. The solder bump 13C may have a cylinder or a cylinder-like profile.

Figure 5:
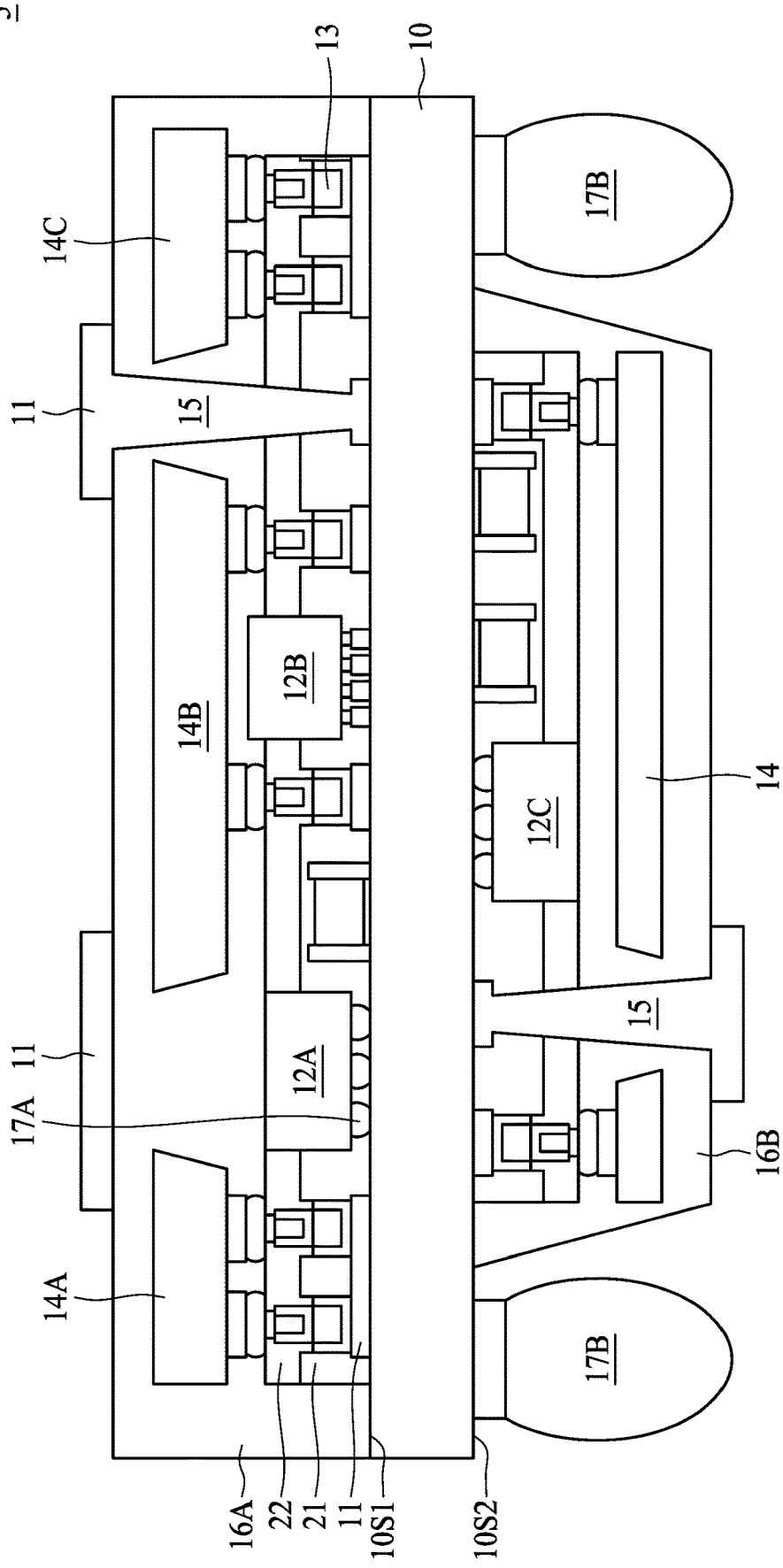
FIG. 5 is a cross-sectional view of a semiconductor device package in accordance with some embodiments of the present disclosure.

FIG. 5 is a cross-sectional view of a semiconductor device package 5 in accordance with some embodiments of the present disclosure. The semiconductor device package 5 is similar to the semiconductor device package 3, and the differences therebetween are described below. In some embodiments, the semiconductor device package 5 includes a dielectric layer 21. In other embodiments, the semiconductor device package 5 includes two dielectric layers 21 and 22.

A material of the dielectric layer 21 may be substantially the same as a material of the dielectric layer 22. A material of the dielectric layer 21 may be different from a material of the dielectric layer 22. The dielectric layers 21 and 22 may include, but are not limited to, molding compounds or pre-impregnated composite fibers (e.g., pre-preg). Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

The dielectric layer 21 is disposed on the substrate. The dielectric layer 21 may cover or encapsulate a portion of the supporting structure 13, a portion of the electronic components 12A and 12B, and a portion of the conductive pillar 15. A lateral surface of the dielectric layer 21 may be surrounded or encapsulated by the package body 16A.

The dielectric layer 22 is disposed on the dielectric layer 21. The dielectric layers 21 and 22 may cover or encapsulate the supporting structure 13, the electronic components 12A and 12B, and a portion of the conductive pillar 15. The dielectric layers 21 and 22 may be surrounded or encapsulated by the package body 16A.

Figure 6A:
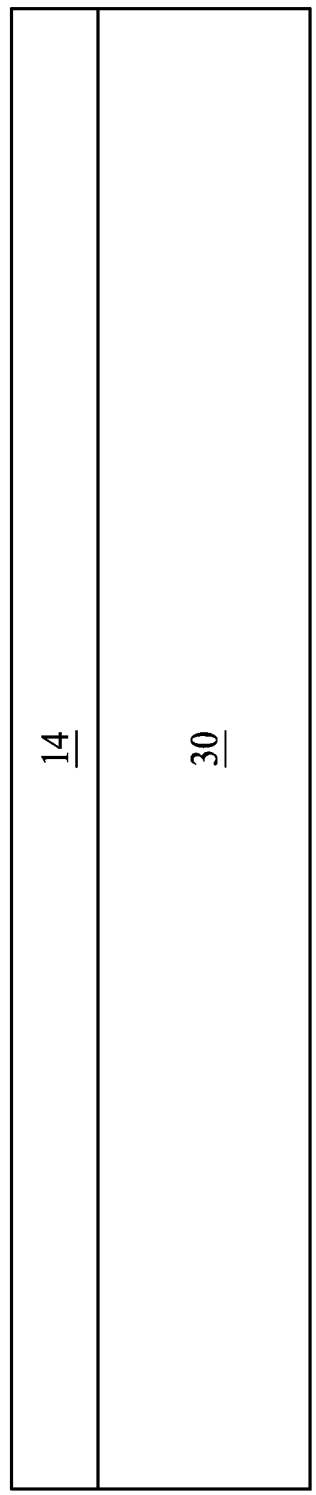
FIG. 6A, FIG. 6B, FIG. 6C, FIG. 6D, FIG. 6E and FIG. 6F illustrate various stages of a method for manufacturing a reinforced structure in accordance with some embodiments of the subject application.

FIG. 6A, FIG. 6B, FIG. 6C, FIG. 6D, FIG. 6E and FIG. 6F illustrate various stages of a method for manufacturing a reinforced structure 14 in accordance with some embodiments of the subject application. Referring to FIG. 6A, the reinforced structure 14 is disposed on the carrier 30. The carrier 30 may include, for example, a printed circuit board, such as a paper-based copper foil laminate, a composite copper foil laminate, or a polymer-impregnated glass-fiber-based copper foil laminate.

Figure 6B:
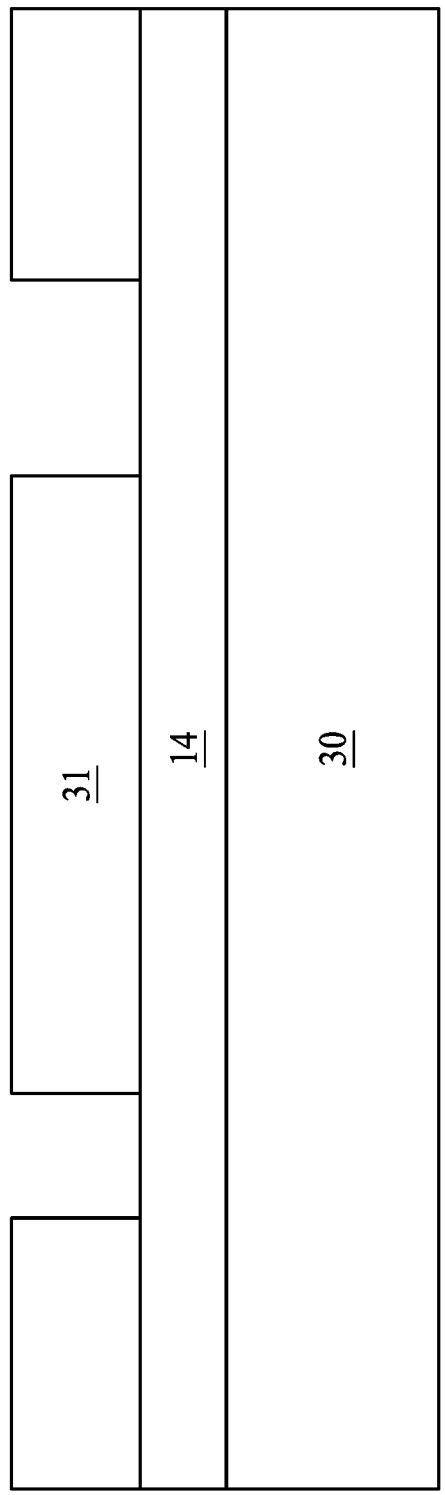
Figure 6C:
Figure 6D:
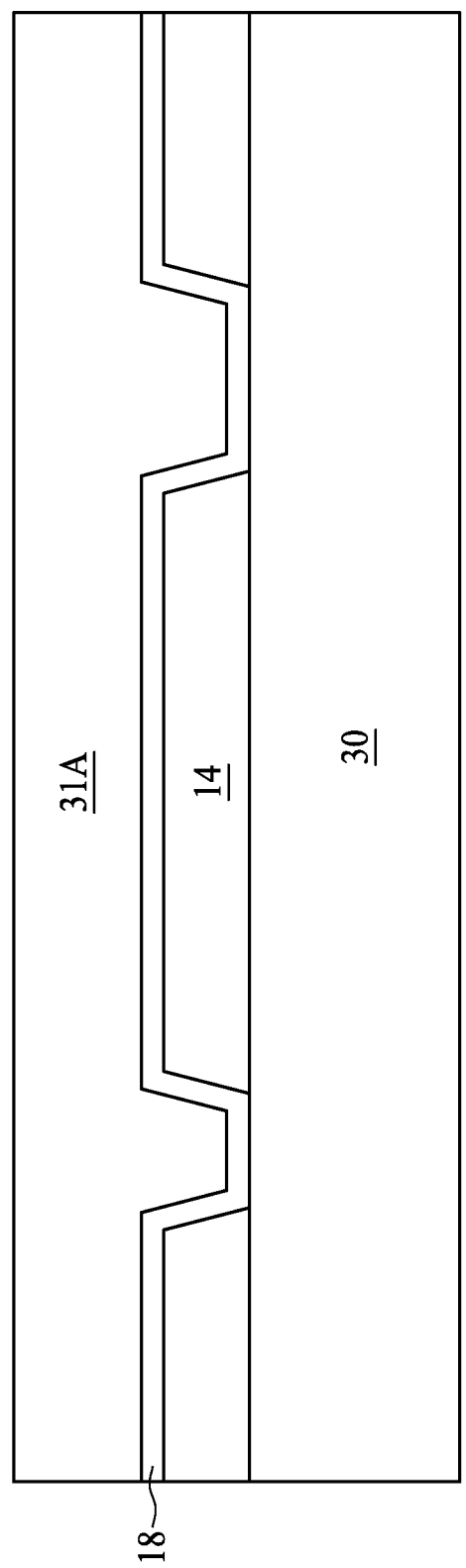

Referring to FIG. 6B, a photo resist layer 31 is disposed and exposed on the reinforced structure 14. Referring to FIG. 6C, the photo resist layer 31 is etched in order to form the connecting structure 18. Referring to FIG. 6D, another photo resist layer 31A is disposed and exposed on the connecting structure 18.

Figure 6E:
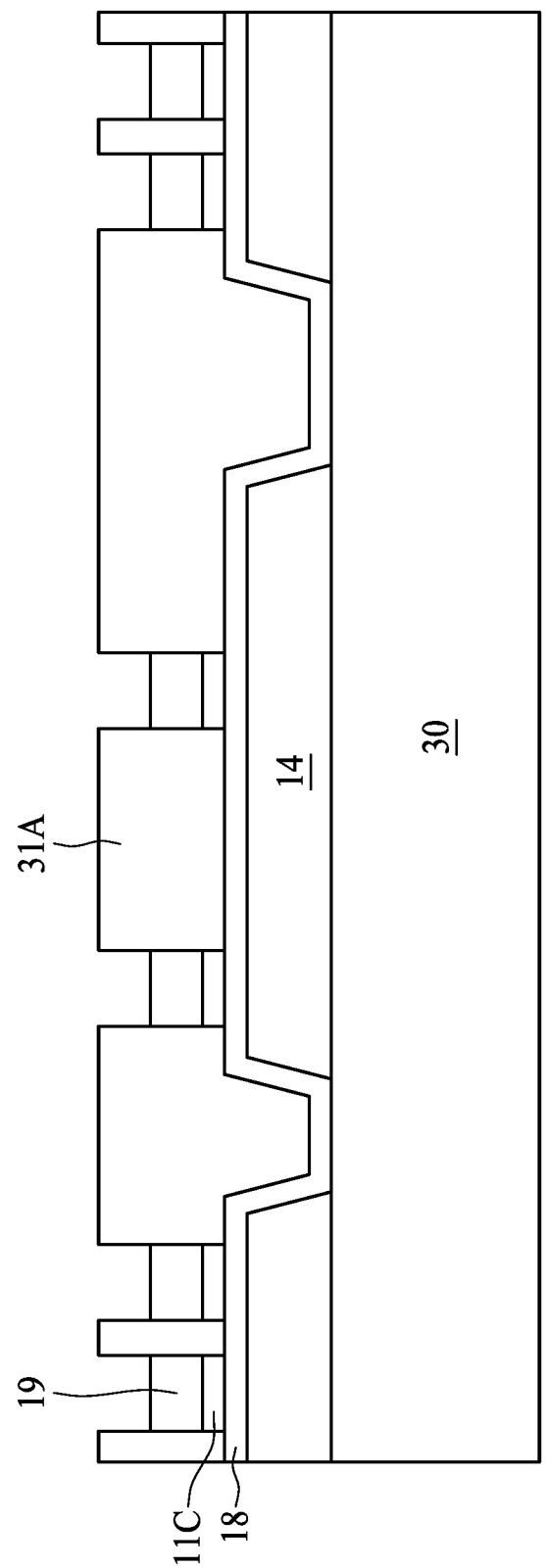
Figure 6F:
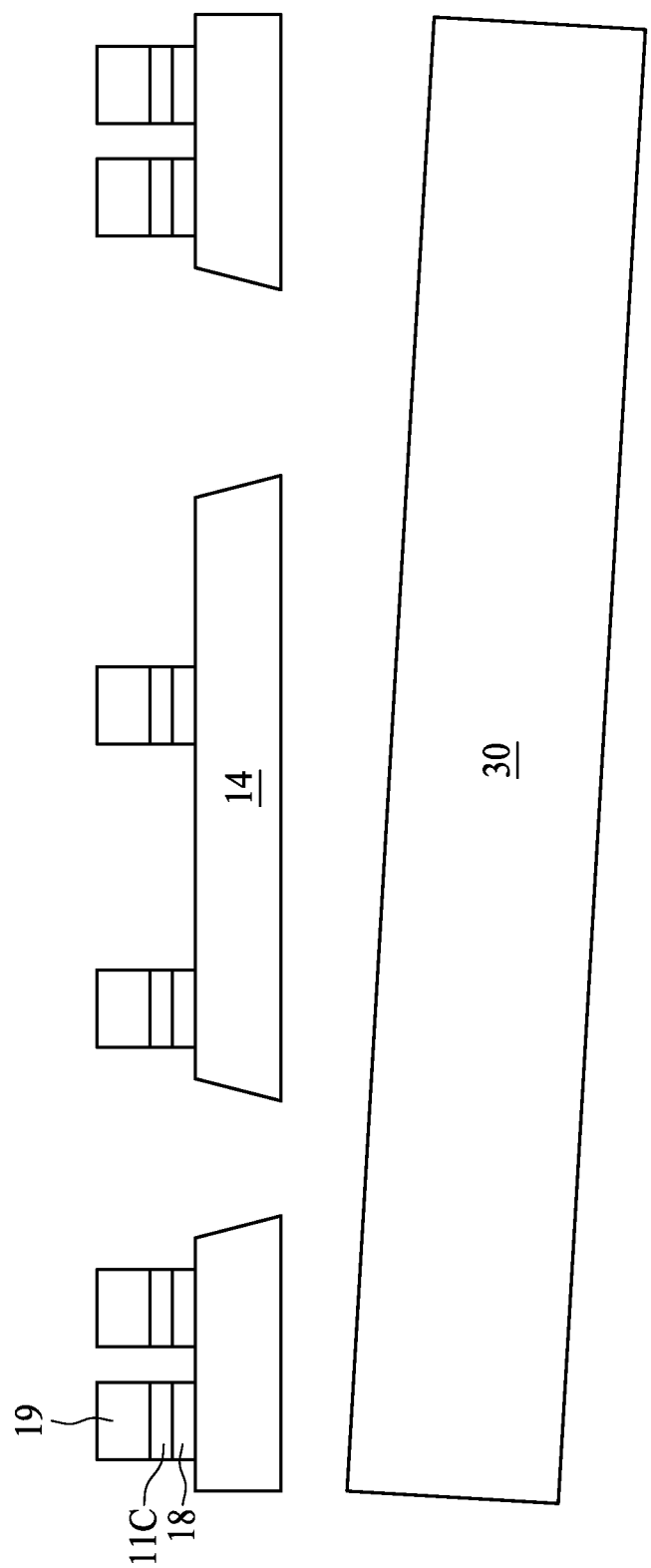

Referring to FIG. 6E, a portion of the photo resist layer 31A is etched. The patterned conductive layer 11C and the connecting layer 19 are disposed on the connecting structure 18. Referring to FIG. 6F, the photo resist layer 31A and the carrier 30 are removed.

Figure 7A:
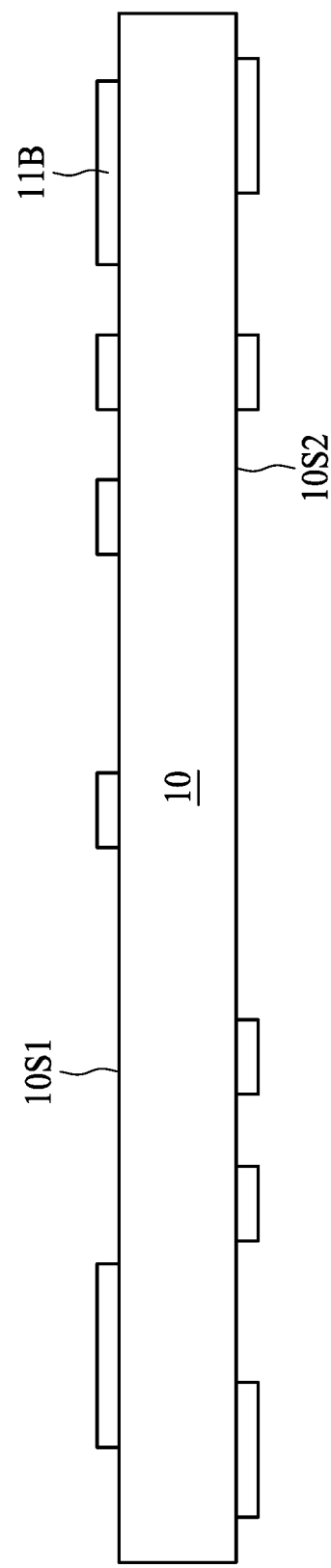
FIG. 7A, FIG. 7B, FIG. 7C, FIG. 7D, FIG. 7E, FIG. 7F, FIG. 7G, FIG. 7H and FIG. 7I illustrate various stages of a method for manufacturing a semiconductor device package in accordance with some embodiments of the subject application.

FIG. 7A, FIG. 7B, FIG. 7C, FIG. 7D, FIG. 7E, FIG. 7F, FIG. 7G, FIG. 7H and FIG. 7I illustrate various stages of a method for manufacturing a semiconductor device package 1 in accordance with some embodiments of the subject application. Referring to FIG. 7A, the patterned conductive layers 11A are formed on two different surfaces 10S1 and 10S2 of the substrate 10.

Figure 7B:
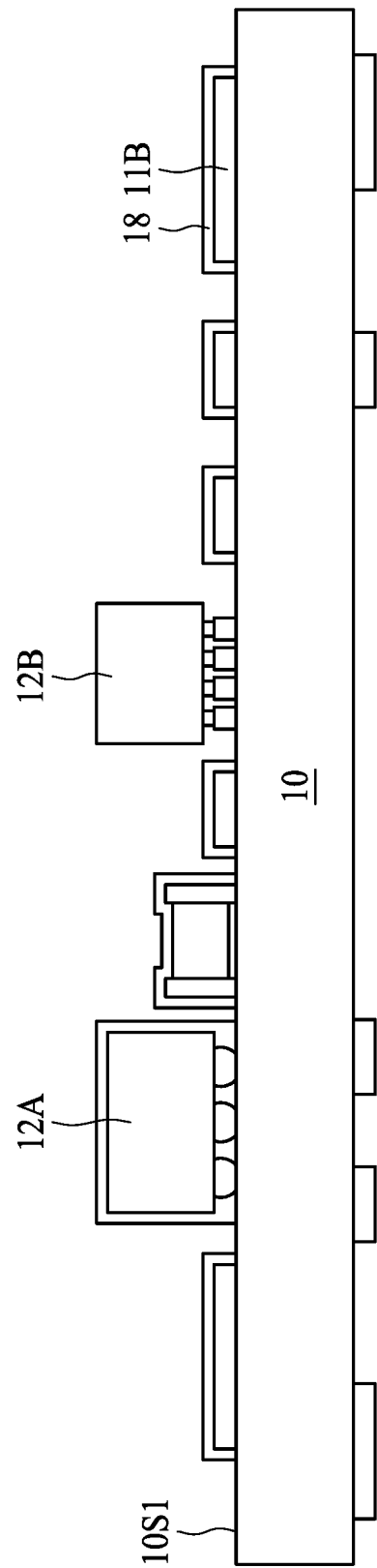
Figure 7C:
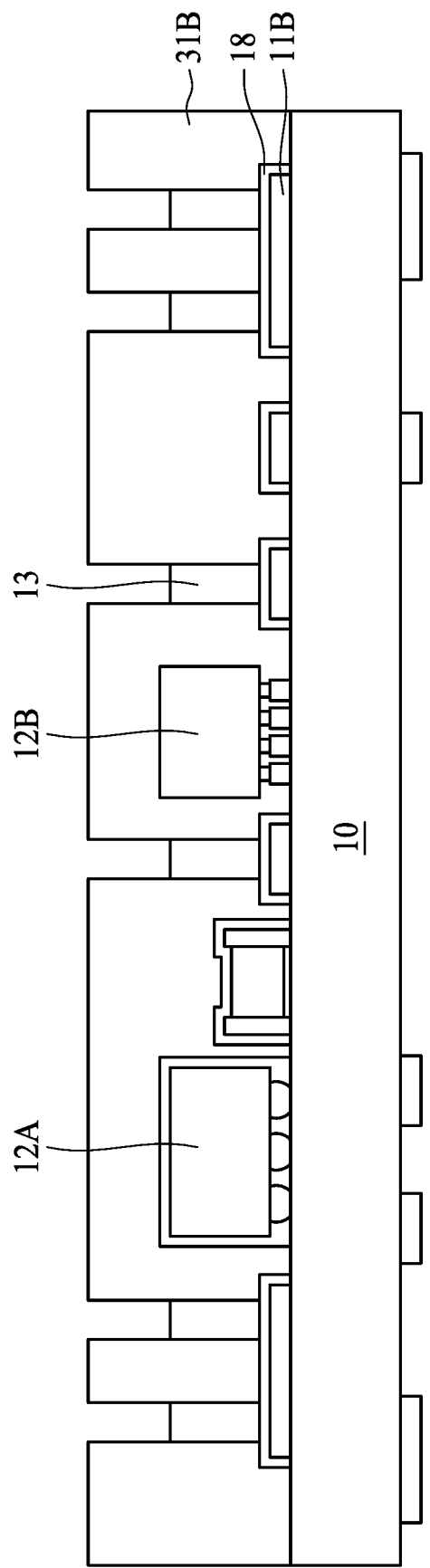

Referring to FIG. 7B, the electronic components 12A and 12B are mounted on the surface 10S1 of the substrate 10. The connecting structure 18 is disposed to cover the patterned conductive layers 11A. Referring to FIG. 7C, the photo resist layer 31B is disposed and exposed on the substrate 10 and the connecting structure 18. The supporting structure 13 is disposed on the connecting structure 18 and surrounded by the photo resist layer 31B.

Figure 7D:
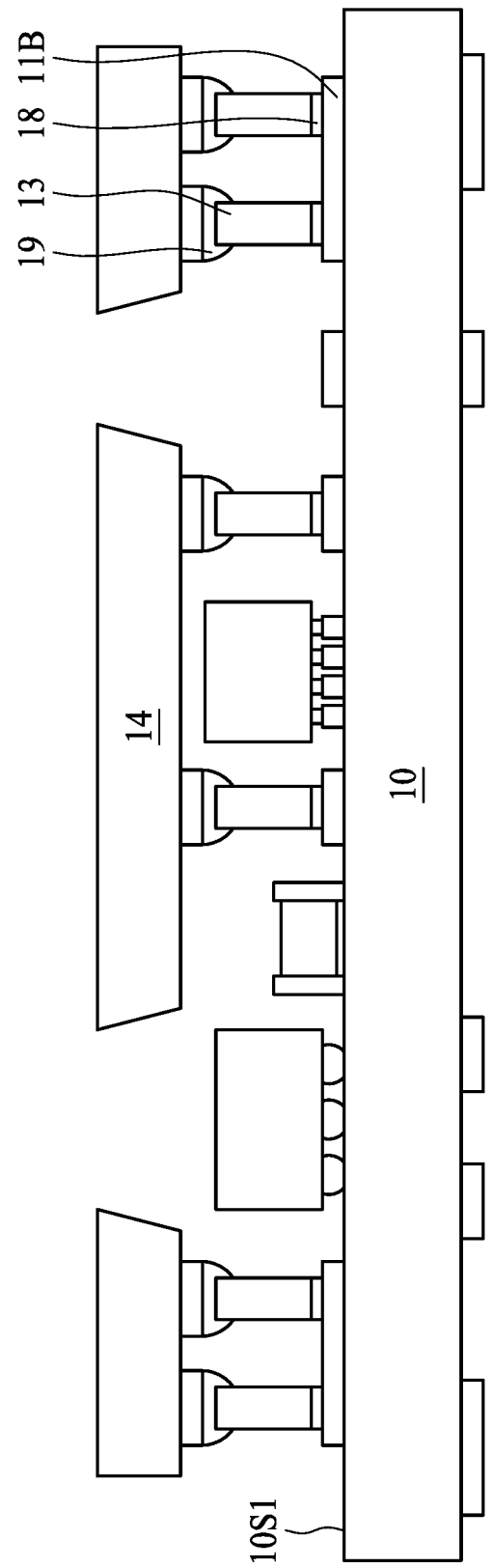
Figure 7E:
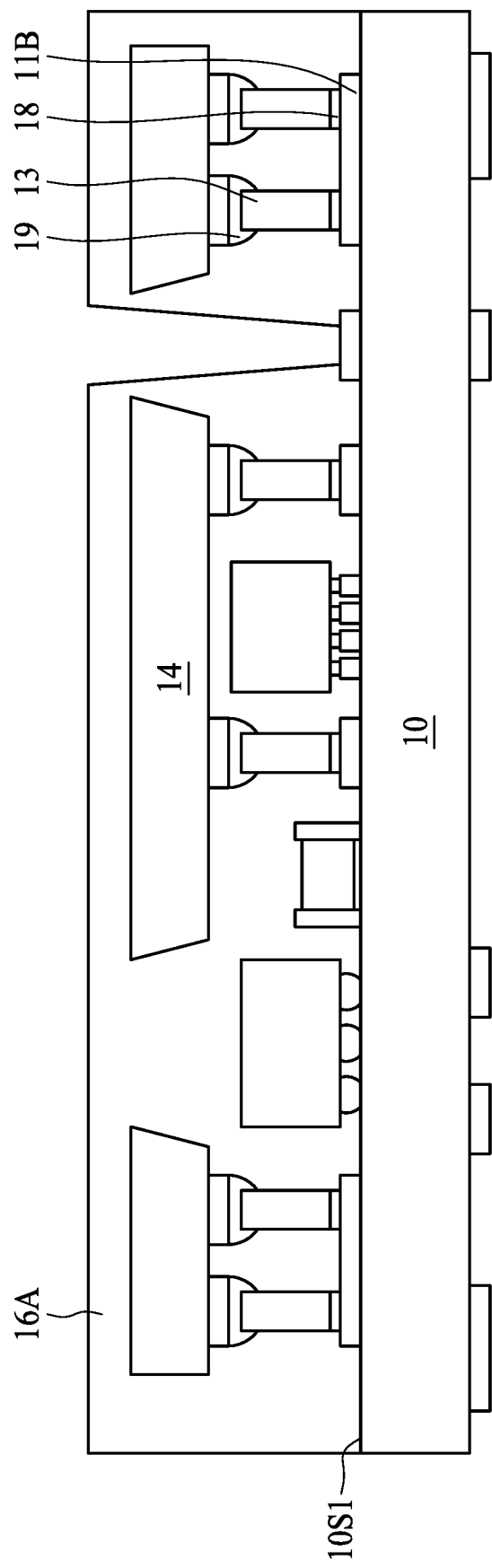

Referring to FIG. 7D, the photo resist layer 31B is removed. The reinforced structure 14 and the connecting layer 19 of FIG. 6F are disposed on the supporting structure 13. Referring to FIG. 7E, the package body 16A is disposed on the surface 10S1 of the substrate 10 for molding.

Figure 7F:
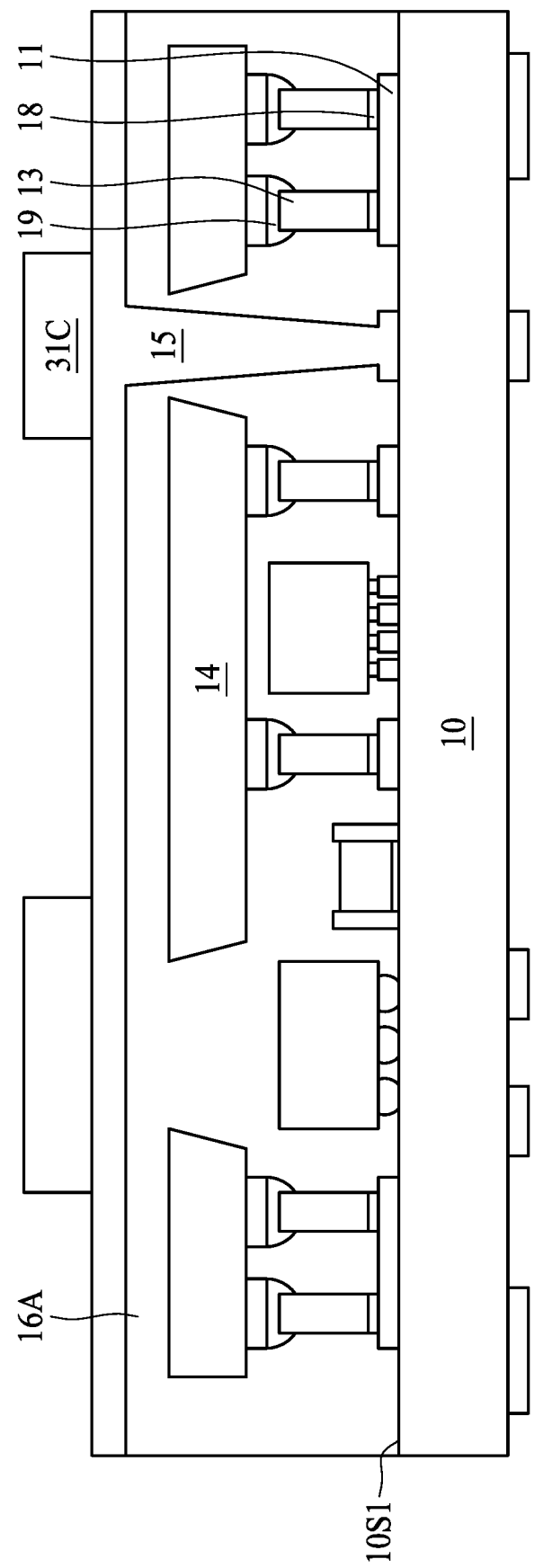
Figure 7G:
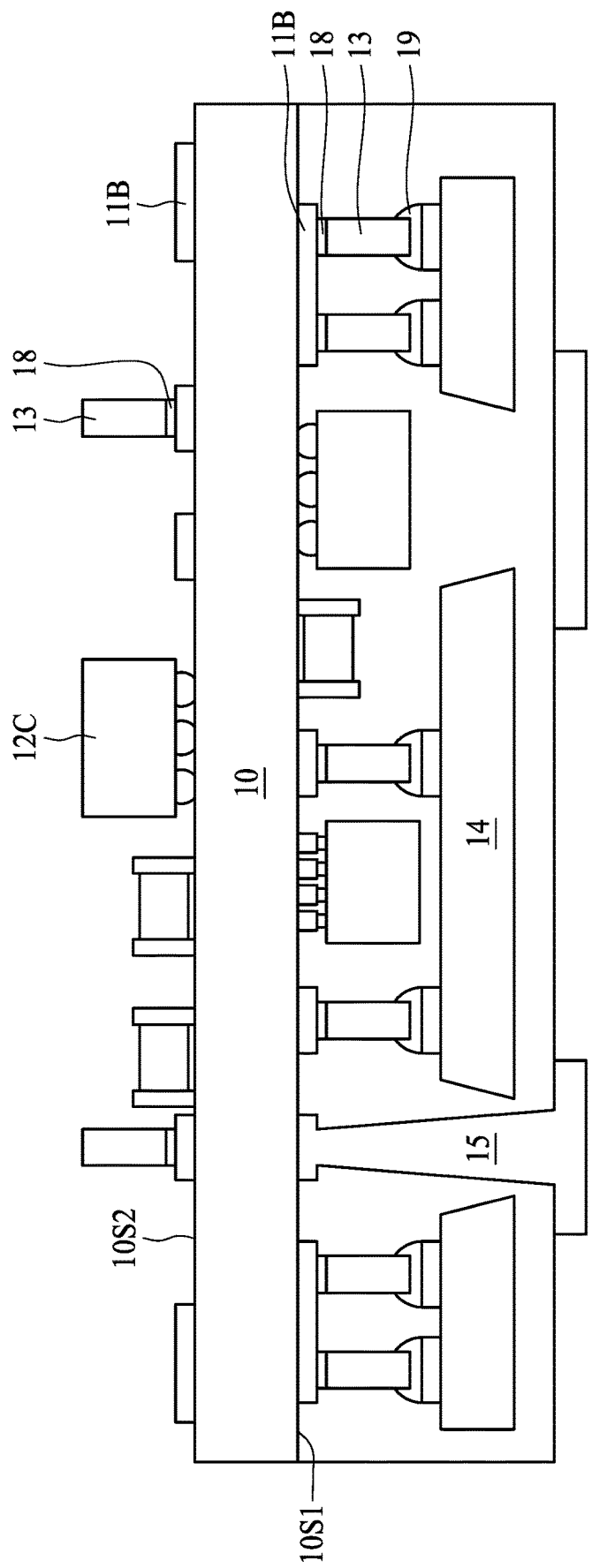

Referring to FIG. 7F, the conductive pillar 15 is formed on the substrate 10 and surrounded by the package body 16A. The photo resist layer 31B is disposed and exposed in order to form the patterned conductive layer 11A. Referring to FIG. 7G, the patterned conductive layer 11B and the electronic component 12C are disposed on the surface 10S2 of the substrate 10. The connecting structure 18 and the supporting structure 13 are disposed on the patterned conductive layer 11B.

Figure 7H:
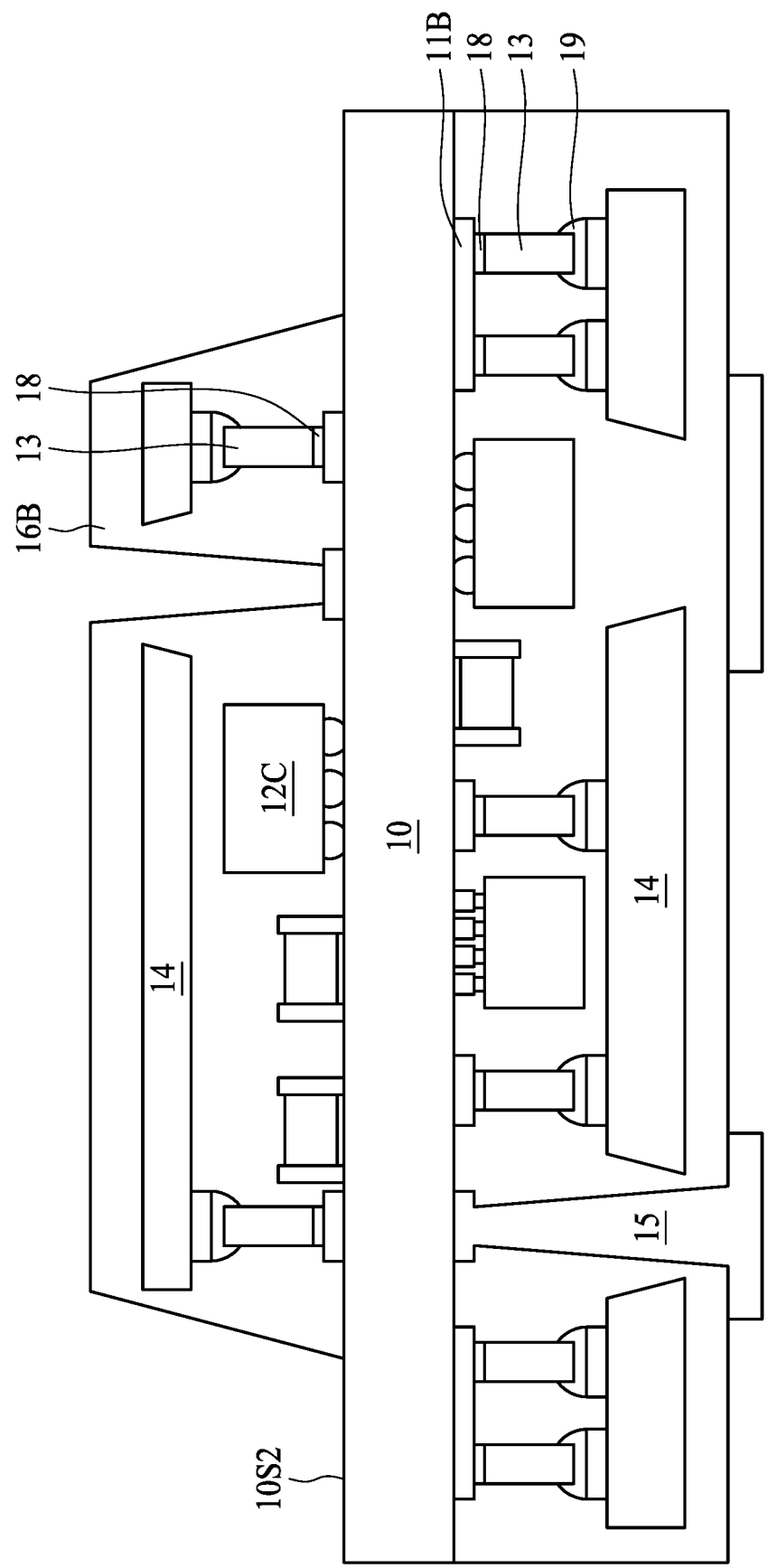
Figure 7I:
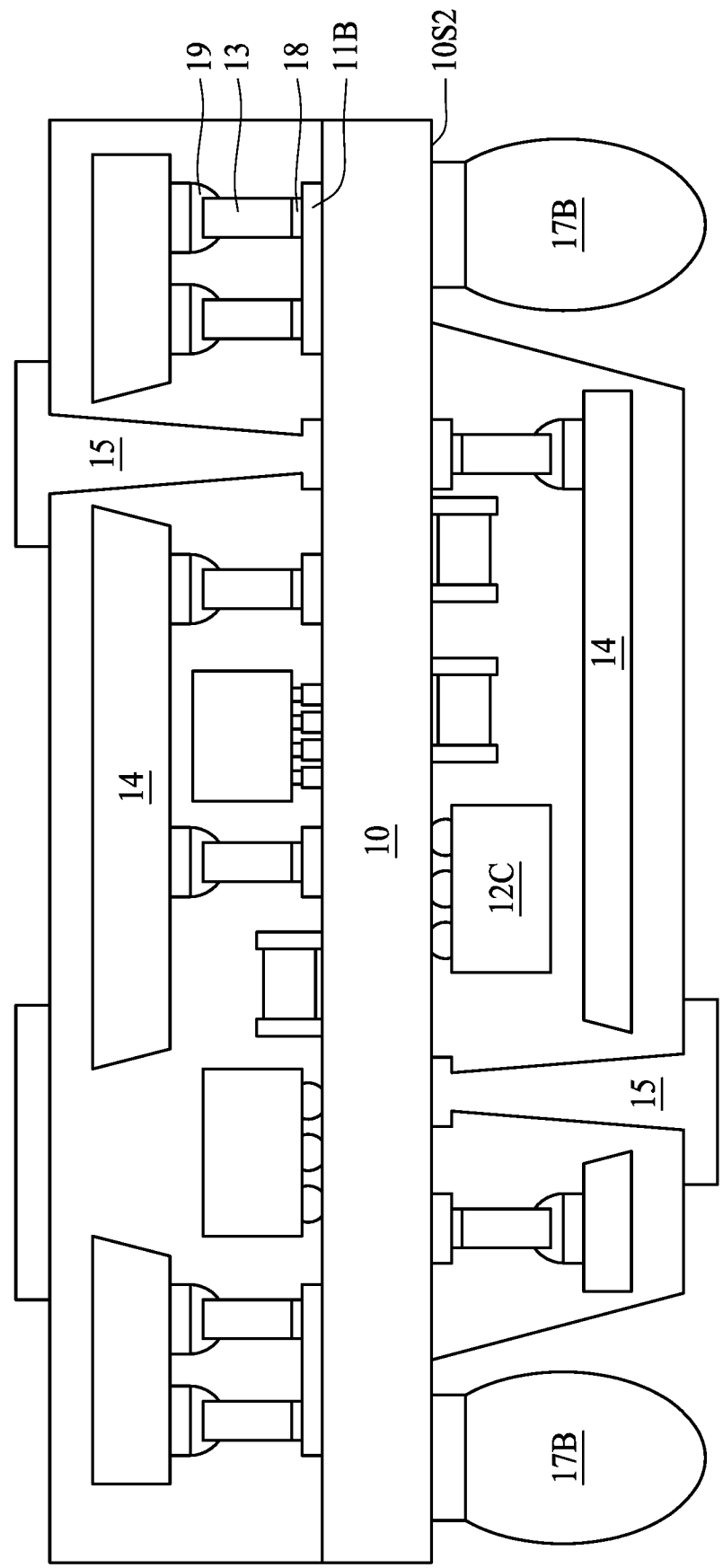

Referring to FIG. 7H, The reinforced structure 14 and the connecting layer 19 of FIG. 6F are disposed on the supporting structure 13. The package body 16A is disposed on the surface 10S2 of the substrate 10 for molding. Referring to FIG. 7I, the conductive pillar 15 is formed on the substrate 10 and surrounded by the package body 16B. The solder balls 17B are disposed on the surface 10S2 of the substrate 10.

Spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

The terms "approximately," "substantially," "substantial" and "about" are used herein to describe and account for small variations. When used in conjunction with an event or circumstance, the terms can refer to instances in which the event or circumstance occurs precisely, as well as instances in which the event or circumstance occurs to a close approximation. As used herein with respect to a given value or range, the term "about" generally means within ±10%, ±5%, ±1%, or ±0.5% of the given value or range. Ranges can be expressed herein as being from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines the features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
a substrate;
a first electronic component disposed over the substrate;
a plurality of first supporting structures disposed over the substrate; and
a first reinforced structure disposed over the first supporting structures and extending in parallel with the substrate,
wherein the first electronic component is electrically connected to the substrate without through the first reinforced structure.

2. A semiconductor device package, comprising:
a substrate having a first surface and a second surface opposite to the first surface;
a plurality of first electronic components disposed over the first surface of the substrate;
a first reinforced structure disposed over the first surface of the substrate; and
a first package body disposed over the substrate and covering the first electronic components and at least a portion of the first reinforced structure;
a second electronic component disposed under the second surface of the substrate;
a second reinforced structure disposed under the second surface of the substrate; and
a second package body disposed under the second surface of the substrate and covering the second electronic component and the second reinforced structure.

3. The semiconductor device package as claimed in claim 1, further comprising:
a first package body encapsulating the first electronic component, wherein the first reinforced structure comprises an opening, and a portion of the first package body is disposed within the opening.

4. The semiconductor device package as claimed in claim 3, further comprising:
a conductive pillar passing through the opening and spaced apart from a sidewall of the first reinforced structure that defines the opening.

5. The semiconductor device package as claimed in claim 4, wherein the first package body contacts at least a lateral surface of the conductive pillar.

6. The semiconductor device package as claimed in claim 1, wherein the first reinforced structure has a top surface, a bottom surface, and an opening extending between the top surface and the bottom surface, and a width of the opening adjacent to the top surface is less than a width of the opening adjacent to the bottom surface in a cross-sectional view.

7. The semiconductor device package as claimed in claim 1, wherein the plurality of first supporting structures comprises bonding wires.

8. The semiconductor device package as claimed in claim 1, wherein the first reinforced structure comprises:
a first part partially overlapping the first electronic component and supported by the plurality of first supporting structures;
a second part not overlapping the first electronic component; and
a plurality of second supporting structures supporting the second part.

9. The semiconductor device package as claimed in claim 8, wherein a distance between abutting second supporting structures is less than a distance between abutting first supporting structures.

10. The semiconductor device package as claimed in claim 1, further comprising:
a first package body disposed over the substrate;
a second package body disposed under the substrate and opposite to the first package body, wherein a portion of a bottom surface of the substrate is exposed by the second package body.

11. The semiconductor device package as claimed in claim 10, further comprising:
a second reinforced structure disposed under the substrate and encapsulated by the second package body, wherein the second reinforced structure overlaps the first electronic component.

12. The semiconductor device package as claimed in claim 11, further comprising:
a second electronic component disposed under the substrate and encapsulated by the second package body, wherein the first electronic component does not overlap the second electronic component along a vertical direction.

13. The semiconductor device package as claimed in claim 11, wherein a width of the second reinforced structure is less than a width of the first reinforced structure in a cross-sectional view.

14. The semiconductor device package as claimed in claim 2, wherein the first reinforced structure at least partially overlaps the second reinforced structure along a vertical direction.

15. The semiconductor device package as claimed in claim 2, further comprising:
first supporting structures configured to support the first reinforced structure; and
second supporting structures configured to support the second reinforced structure,
wherein a quantity of the first supporting structures is greater than a quantity of the second supporting structures.

16. The semiconductor device package as claimed in claim 2, wherein a thickness of the first reinforced structure is greater than a thickness of the second reinforced structure.

17. The semiconductor device package as claimed in claim 2, further comprising:
a soldering material connected to the second surface of the substrate, wherein the soldering material is exposed by the second package body, and the second package body has a slanted surface adjacent to the soldering material and overlapping the first reinforced structure along a vertical direction.

18. The semiconductor device package as claimed in claim 2, further comprising:
a pillar disposed within an opening of the first reinforced structure, wherein the pillar is tapered toward the substrate.

19. The semiconductor device package as claimed in claim 18, wherein the pillar comprises a non-conductive pillar.

20. The semiconductor device package as claimed in claim 18, wherein the opening extends between a top surface and a bottom surface of the first reinforced structure, and the pillar exceeds the top surface and the bottom surface of the first reinforced structure.

* * * * *